(12) United States Patent
Fujino et al.

(10) Patent No.: US 10,727,163 B2
(45) Date of Patent: Jul. 28, 2020

(54) SEMICONDUCTOR DEVICE

(71) Applicant: Mitsubishi Electric Corporation, Chiyoda-ku, Tokyo (JP)

(72) Inventors: Junji Fujino, Tokyo (JP); Yuji Imoto, Tokyo (JP); Shohei Ogawa, Tokyo (JP); Mikio Ishihara, Tokyo (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 0 days.

(21) Appl. No.: 16/301,893

(22) PCT Filed: Jul. 25, 2017

(86) PCT No.: PCT/JP2017/026893
§ 371 (c)(1),
(2) Date: Nov. 15, 2018

(87) PCT Pub. No.: WO2018/021322
PCT Pub. Date: Feb. 1, 2018

(65) Prior Publication Data
US 2019/0189537 A1    Jun. 20, 2019

(30) Foreign Application Priority Data

Jul. 26, 2016  (JP) .................. 2016-145992

(51) Int. Cl.
*H01L 23/48* (2006.01)
*H01L 23/00* (2006.01)

(52) U.S. Cl.
CPC .............. *H01L 23/48* (2013.01); *H01L 24/09* (2013.01); *H01L 24/33* (2013.01); *H01L 24/35* (2013.01);
(Continued)

(58) Field of Classification Search
CPC . H01L 23/488; H01L 23/492; H01L 23/4924; H01L 23/4951; H01L 23/49517;
(Continued)

(56) References Cited

U.S. PATENT DOCUMENTS 8,957,508 B2 *  2/2015  Nagaune ............. H01L 23/4334
                                                            257/675
9,761,516 B1 *  9/2017  Knickerbocker ....... H01L 23/15
(Continued)

FOREIGN PATENT DOCUMENTS

JP        1056131 A      2/1998
JP     2005064441 A      3/2005
(Continued)

OTHER PUBLICATIONS

International Search Report (PCT/ISA/210) dated Sep. 12, 2017, by the Japan Patent Office as the International Searching Authority for International Application No. PCT/JP2017/026893.

*Primary Examiner* — Joseph C. Nicely
(74) *Attorney, Agent, or Firm* — Buchanan Ingersoll & Rooney PC

(57) ABSTRACT

A semiconductor device includes a semiconductor element having a front electrode, an electrode plate having an area larger than the front electrode of the semiconductor element in a two-dimensional view and made of aluminum or aluminum alloy, and a metal member having a joint surface joined to the front electrode of the semiconductor element with solder, having an area smaller than the front electrode of the semiconductor element in a two-dimensional view, made of a metal different from the electrode plate, and fastened to the electrode plate to electrically connect the front electrode of the semiconductor element to the electrode plate.

13 Claims, 11 Drawing Sheets

(52) U.S. Cl.
CPC .............. *H01L 24/37* (2013.01); *H01L 24/40* (2013.01); *H01L 24/06* (2013.01); *H01L 24/45* (2013.01); *H01L 24/48* (2013.01); *H01L 24/84* (2013.01); *H01L 2224/05553* (2013.01); *H01L 2224/05624* (2013.01); *H01L 2224/0603* (2013.01); *H01L 2224/29111* (2013.01); *H01L 2224/29339* (2013.01); *H01L 2224/29347* (2013.01); *H01L 2224/32225* (2013.01); *H01L 2224/33* (2013.01); *H01L 2224/33181* (2013.01); *H01L 2224/352* (2013.01); *H01L 2224/37011* (2013.01); *H01L 2224/37026* (2013.01); *H01L 2224/37124* (2013.01); *H01L 2224/37147* (2013.01); *H01L 2224/40137* (2013.01); *H01L 2224/45014* (2013.01); *H01L 2224/45015* (2013.01); *H01L 2224/45124* (2013.01); *H01L 2224/45144* (2013.01); *H01L 2224/45147* (2013.01); *H01L 2224/45565* (2013.01); *H01L 2224/45624* (2013.01); *H01L 2224/48091* (2013.01); *H01L 2224/48472* (2013.01); *H01L 2224/73265* (2013.01); *H01L 2224/83* (2013.01); *H01L 2224/84801* (2013.01); *H01L 2224/85205* (2013.01); *H01L 2224/92147* (2013.01); *H01L 2924/1033* (2013.01); *H01L 2924/10253* (2013.01); *H01L 2924/10272* (2013.01); *H01L 2924/1203* (2013.01); *H01L 2924/13055* (2013.01); *H01L 2924/13091* (2013.01); *H01L 2924/181* (2013.01); *H01L 2924/3511* (2013.01)

(58) Field of Classification Search
CPC ........... H01L 23/4922; H01L 23/49541; H01L 23/49838; H01L 24/07; H01L 24/09; H01L 24/08; H01L 23/33; H01L 23/49524; H01L 23/49575; H01L 24/33; H01L 24/49524; H01L 24/49575
See application file for complete search history.

(56) References Cited

U.S. PATENT DOCUMENTS

| | | | |
|---|---|---|---|
| 2009/0230519 A1* | 9/2009 | Otremba | H01L 23/49524 257/666 |
| 2010/0244213 A1* | 9/2010 | Nozaki | H01L 23/49524 257/676 |
| 2012/0074516 A1 | 3/2012 | Yamaguchi et al. | |
| 2013/0270700 A1* | 10/2013 | Yu | H01L 23/498 257/738 |
| 2016/0126163 A1* | 5/2016 | Tee | H01L 23/49548 257/676 |
| 2016/0141284 A1* | 5/2016 | Ishihara | H01L 24/48 257/140 |
| 2016/0293549 A1* | 10/2016 | Otremba | H01L 23/49548 |
| 2017/0271247 A1* | 9/2017 | Hayase | H01L 23/492 |

FOREIGN PATENT DOCUMENTS

| | | |
|---|---|---|
| JP | 2011014678 A | 1/2011 |
| JP | 2012074543 A | 4/2012 |
| JP | 2014116531 A | 6/2014 |

* cited by examiner

SEMICONDUCTOR DEVICE

TECHNICAL FIELD

The present invention relates to a semiconductor device including a semiconductor element.

BACKGROUND ART

In a semiconductor device, a power semiconductor element suitable for high voltage and large current applications is provided in a case, and a main terminal electrically connected to an electrode of the semiconductor element through a circuit pattern formed on a substrate and a wiring member such as a lead frame is provided on the outside of the case to make a package. The main terminal of the semiconductor device is connected to an external electric circuit. The semiconductor device mounted on equipment controls the operation of the equipment by controlling current flowing through the external electric circuit. Semiconductor devices are readily mounted on equipment and thus used in a wide variety of fields ranging from industrial equipment to home appliances.

A semiconductor element in a semiconductor device has a vertical structure having a front electrode and a back electrode, in which high voltage is applied between the front electrode and the back electrode and large current flows. In a semiconductor device, the back electrode of the semiconductor element is joined to an insulating substrate of a ceramic material with high thermal conductivity so that heat generated by the semiconductor element is efficiently dissipated. The electrical resistance of wiring connected to the front electrode of the semiconductor element is reduced by joining an electrode plate such as lead frame directly to the front electrode of semiconductor element with solder. The electrode plate has an area larger than the front electrode of the semiconductor element and is joined to the front electrode(s) of one or more semiconductor elements in the semiconductor device. The electrode plate is formed of a metal with high electrical conductivity, such as copper and aluminum. When the electrode plate is formed of aluminum, the surface of the electrode plate is metallized, for example, plated with copper to allow solder to wet.

In a conventional semiconductor device, the electrode plate has a half cut portion protruding from the surface of the electrode plate and an embossed portion further protruding from the half cut portion. The half cut portion on the protruding side is joined to the front electrode of the semiconductor element with solder. The embossed portion is brought into abutment and joined to the front electrode of the semiconductor element with solder, so that the amount of solder with the same thickness as the height of the embossed portion is kept between the front electrode of semiconductor element and the half cut portion of the electrode plate (for example, see PTL 1).

CITATION LIST

Patent Literature

PTL 1: Japanese Patent Laying-Open No. 2012-74543

SUMMARY OF INVENTION

Technical Problem

Unfortunately, in the conventional semiconductor device described in PTL 1, since the area of the electrode plate is larger than the front electrode of the semiconductor element, heating during solder joining may cause warpage or thermal deformation of the electrode plate to increase the distance between the electrode plate and the front electrode of the semiconductor element. In this case, solder wets and spreads and is absorbed by the electrode plate, causing a lack of solder at the solder joint portion between the electrode plate and the front electrode of the semiconductor element.

The present invention is made in order to solve the problem as described above and is aimed to provide a semiconductor device that can prevent solder from being absorbed by the electrode plate when the electrode plate is electrically connected to the front electrode of semiconductor element using a solder joint.

Solution to Problem

A semiconductor device according to the present invention includes: a semiconductor element having a front electrode; an electrode plate having an area larger than the front electrode of the semiconductor element in a two-dimensional view and formed of aluminum or aluminum alloy; and a metal member having a joint surface joined to the front electrode of the semiconductor element with solder, having an area smaller than the front electrode of the semiconductor element in a two-dimensional view, formed of a metal different from the electrode plate, and fastened to the electrode plate to electrically connect the front electrode of the semiconductor element to the electrode plate.

Advantageous Effects of Invention

In the semiconductor device according to the present invention, the front electrode of the semiconductor element is joined to the metal member with solder by fastening the electrode plate of aluminum or aluminum alloy and the metal member to each other. This prevents solder from wetting the electrode plate thereby preventing solder from being absorbed by the electrode plate.

DESCRIPTION OF EMBODIMENTS

First Embodiment

Figure 1:
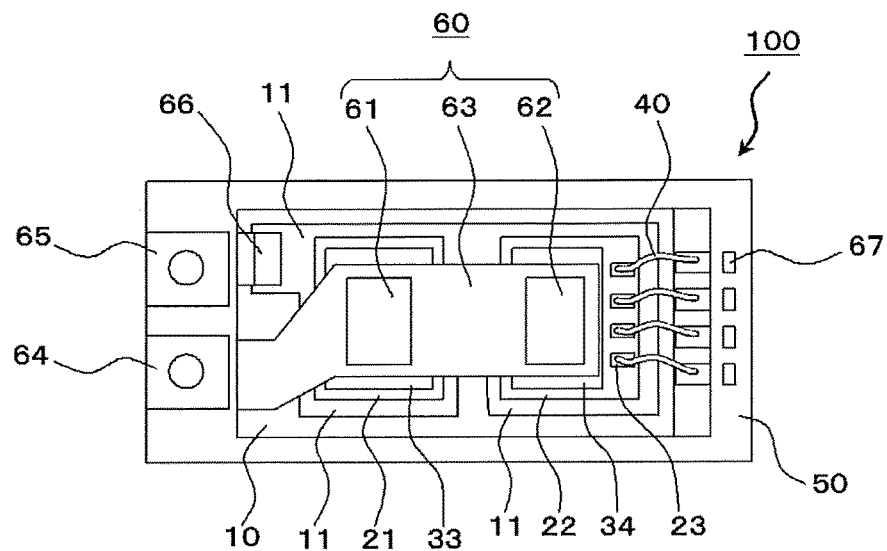
FIG. 1 is a plan view showing a semiconductor device in a first embodiment of the present invention.
Figure 2:
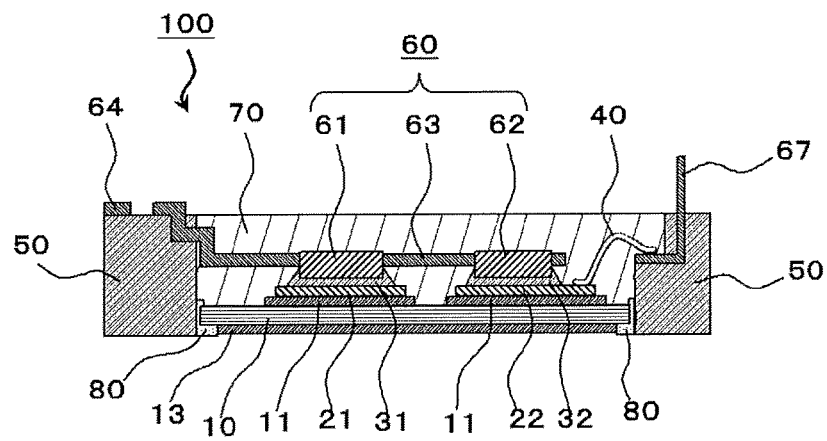
FIG. 2 is a cross-sectional view showing the semiconductor device in the first embodiment of the present invention.

First of all, a configuration of a semiconductor device in a first embodiment of the present invention will be described. FIG. 1 is a plan view showing the semiconductor device in the first embodiment of the present invention. FIG. 2 is a cross-sectional view showing the semiconductor device in the first embodiment of the present invention. In FIG. 1, a sealing resin portion 70 is not shown.

In FIG. 1 and FIG. 2, a semiconductor device 100 includes an insulating substrate 10, semiconductor elements 21, 22 each having a back electrode joined to a conductor layer 11 provided on insulating substrate 10, a first lead frame 60 electrically connected to the front electrodes of semiconductor elements 21, 22 and through which main circuit current flows, a second lead frame 67 electrically connected to semiconductor elements 21, 22 and receiving a control signal for controlling semiconductor elements 21, 22, a sealing resin portion 70 covering semiconductor elements 21, 22 and the peripheral members around semiconductor elements 21, 22, and a case 50 accommodating these components. First lead frame 60 includes an electrode plate 63 having an area larger than the front electrodes of semiconductor elements 21, 22 in a two-dimensional view and made of aluminum or aluminum alloy and metal members 61, 62 having an area smaller than the front electrodes of semiconductor elements 21, 22 in a two-dimensional view, fastened to electrode plate 63, and joined to the front electrodes of semiconductor elements 21, 22 with solder. As used herein the main circuit current is current flowing through an electric circuit configured using semiconductor device 100. Semiconductor device 100 is used for controlling conduction and cut-off of main circuit current flowing between the front electrode and the back electrode.

Insulating substrate 10 is formed with an insulator substrate such as a ceramic substrate with high thermal conductivity, such as aluminum nitride (AlN), and, for example, has outer dimensions of 40 mm×25 mm and a thickness of 0.6 mm. The front surface of insulating substrate 10 is provided with conductor layer 11 formed of a metal with high electrical conductivity, such as copper (Cu) or copper alloy. The back surface of insulating substrate 10 is provided with a conductor layer 13 formed of a metal with high thermal conductivity, such as copper or copper alloy. Conductor layer 11 on the front surface side and conductor layer 13 on the back surface side may be formed of different materials but preferably formed of the same material for reducing manufacturing costs. Conductor layer 11 and conductor layer 13 are formed of, for example, copper with a thickness of 0.4 mm.

Insulating substrate 10 is not limited to an aluminum nitride substrate and may be any substrate that provides insulating properties and on which a conductor layer, such as copper, wettable by solder can be formed. Examples include ceramic substrates, such as alumina (Al2O3), silicon carbide (SiC), and silicon nitride (Si3N4), and substrates other than ceramics, such as glass epoxy substrates and metal base substrates.

Conductor layer 11 has a circuit pattern for allowing main circuit current to flow through semiconductor elements 21, 22. Since semiconductor elements 21, 22 are joined by a bonding material such as solder and die bond, conductor layer 11 is preferably metal with high electrical conductivity. Conductor layer 13 is preferably a metal with high thermal conductivity since it is joined by a bonding material such as solder to a heatsink (not shown) for dissipating heat generated in semiconductor elements 21, 22 to the outside of semiconductor device 100. Thus, conductor layer 11 and conductor layer 13 are preferably copper or copper alloy or may be a metal material formed by metallizing the surface of a solder-nonwettable metal material with high electrical conductivity and thermal conductivity, such as aluminum and aluminum alloy, with tin (Sn), nickel (Ni), gold (Au), silver (Ag), or the like for achieving solder wetting.

Semiconductor element 21 and semiconductor element 22 are power semiconductor switching elements or control ICs (Integrated Circuits) such as diodes, IGBTs (Insulated Gate Bipolar Transistors), and MOSFETs (Metal-Oxide-Semiconductor Field-Effect Transistors). In the present invention, semiconductor element 21 is a diode, and semiconductor element 22 is an IGBT. Semiconductor elements 21, 22 are formed of a semiconductor material such as silicon (Si), silicon carbide (SiC), and gallium nitride (GaN). Semiconductor elements 21, 22 have, for example, outer dimensions of 15 mm×15 mm and a thickness of 0.3 mm.

As shown in FIG. 1 and FIG. 2, in the present invention, semiconductor device 100 is a semiconductor device of 1-in-1 configuration including a pair of semiconductor element 21 that is a diode and semiconductor element 22 that is an IGBT. However, the semiconductor device may be a semiconductor device of 2-in-1 configuration including two pairs of diode and IGBT or a semiconductor device of 6-in-1 configuration including six pairs. The semiconductor device may include a semiconductor switching element such as MOSFET in place of IGBT.

Semiconductor element 21 that is a diode and semiconductor element 22 that is an IGBT each have a back electrode joined to insulating substrate 10 with conductor layer 11 interposed and a front electrode provided on a surface opposite to the back electrode. First lead frame 60 is connected to the front electrode. Main circuit current flows between the front electrodes and the back electrodes of semiconductor elements 21, 22, and semiconductor elements 21, 22 control conduction and cut-off of main circuit current based on a control signal input to control electrodes provided on semiconductor elements 21, 22.

Semiconductor element 21 that is a diode has a cathode electrode as the back electrode on the back surface side and has an anode electrode as the front electrode on the front surface side. Semiconductor element 22 that is an IGBT has a collector electrode as the back electrode on the back surface side and has an emitter electrode as the front electrode and a gate electrode as the control electrode on the front surface side. The gate electrode that is the control electrode is electrically connected to second lead frame 67 through wire 40. The control electrode is not limited to the gate electrode of semiconductor element 22, and the electrode such as a temperature sensor provided in semiconductor device 100 is also called control electrode. Although front electrode 33 of semiconductor element 21 and front electrode 34 of semiconductor element 22 are shown in FIG. 1, they are not shown in FIG. 2.

The back electrodes of semiconductor element 21 and semiconductor element 22 are joined to conductor layer 11 provided on insulating substrate 10 with a bonding material (not shown) such as solder. That is, semiconductor elements 21, 22 have the back electrodes joined to insulating substrate 10 with conductor layer 11 interposed. A terminal plate 66 formed of a metal with high electrical conductivity such as aluminum and aluminum alloy is joined to conductor layer 11, for example, by ultrasonic bonding or other methods. Terminal plate 66 has a main terminal 65 to be fixed to case 50. The back electrodes of semiconductor elements 21, 22 are thus electrically connected to main terminal 65. Main terminal 65 has a screw hole for attaching an external wiring member by a screw. Main terminal 65 has, for example, a width of 10 mm and a thickness of 0.6 mm and may be plated with copper or nickel if necessary.

First lead frame 60 is configured such that metal members 61, 62 formed of a solder-wettable metal material such as copper or copper alloy are fastened to electrode plate 63 formed of solder-nonwettable aluminum or aluminum alloy. Electrode plate 63 has an area larger than the front electrodes of semiconductor elements 21, 22 and has an area larger than metal members 61, 62 in a two-dimensional view. Metal members 61, 62 have an area smaller than the front electrodes of semiconductor elements 21, 22 and have an area smaller than electrode plate 63 in a two-dimensional view. Metal members 61, 62 may be entirely formed of copper or copper alloy, or metal members 61, 62 formed of copper or copper alloy may be metallized with a solder-wettable metal material, such as silver plating or nickel plating. Metal members 61, 62 may be formed of a solder-wettable metal such as nickel, silver, and gold, rather than copper or copper alloy, but copper or copper alloy is preferred because it is superior in terms of electrical conductivity and costs.

Alternatively, metal members 61, 62 may be formed, instead of copper or copper alloy, with a stack of metal layers, such as a copper-tungsten (Cu—W) baked material or a copper/Invar/copper (CIC) cladding layer with low thermal expansion coefficient as long as the portions joined to the front electrodes of semiconductor elements 21, 22 with solder are formed of copper or copper alloy. That is, metal members 61, 62 may be formed only with a first metal layer of copper or copper alloy or may be formed by stacking a plurality of metal layers including a first metal layer and a second metal layer made of a metal different from the first metal layer, where the first metal layer has a joint surface joined to front electrodes 33, 34 of semiconductor elements 21, 22 with solder.

As used in the present invention, aluminum refers to aluminum with a purity equal to or higher than 99.00%, specifically 1000 series aluminum in JIS standards. Aluminum alloy refers to an alloy mainly composed of aluminum, specifically 2000 series to 8000 series aluminum alloys in JIS standards. Copper refers to 1000 series copper in JIS standards, and copper alloy refers to 2000 series to 7000 series copper alloys in JIS standards.

Electrode plate 63 and metal members 61, 62 are joined without a bonding material such as solder, and electrode plate 63 is electrically connected in contact with metal members 61, 62. The detail of the process of fastening metal members 61, 62 to electrode plate 63 will be described later. For example, as shown in FIG. 1 and FIG. 2, electrode plate 63 and metal members 61, 62 are fastened to each other by inserting metal members 61, 62 in intimate contact with the openings provided in electrode plate 63.

Electrode plate 63 is formed of, for example, aluminum or aluminum alloy with a thickness of 0.6 mm, and the surface of electrode plate 63 is also formed of the same aluminum or aluminum alloy as the interior of electrode plate 63. That is, the entire electrode plate 63 is formed of aluminum or aluminum alloy and is not wettable by solder because of the presence of a strong native oxide film on the surface of electrode plate 63. Since electrode plate 63 electrically connects the front electrodes of a plurality of semiconductor elements or electrically connects to an electric circuit external to the semiconductor device, electrode plate 63 has an area larger than the front electrode of the semiconductor element in a two-dimensional view. Metal members 61, 62 are formed of, for example, copper or copper alloy with outer dimensions of 8 mm×8 mm and a thickness of 1 mm. Metal members 61, 62 may be fastened to electrode plate 63, for example, by shrink fitting, heat crimping, or pressing, or metal members 61, 62 may be fastened to electrode plate 63 by ultrasonic welding or thermocompression bonding.

As shown in FIG. 2, since the thickness of metal members 61, 62 of first lead frame 60 is larger than the thickness of electrode plate 63, metal member 61 and metal member 62 partially protrude from electrode plate 63. In this way, metal members 61, 62 have a protrusion such that part of metal members 61, 62 forms a convex portion protruding from the surface of electrode plate 63, and metal members 61, 62 and electrode plate 63 are fastened to each other to form first lead frame 60. Metal members 61, 62 may not necessarily have a protrusion protruding from the surface of electrode plate 63, and the joint surface of metal members 61, 62 to semiconductor elements 21, 22 may be flush with or depressed from the surface of electrode plate 63. However, it is preferable that metal members 61, 62 have a protrusion protruding from the surface of electrode plate 63 because if so the joining strength of solder joint between the protrusions of metal members 61, 62 and semiconductor elements 21, 22 can be increased and the reliability of joint can be enhanced.

As shown in FIG. 2, metal member 61 of first lead frame 60 and the front electrode of semiconductor element 21 are joined with solder 31, and metal member 62 of first lead frame 60 and the front electrode of semiconductor element 22 are joined with solder 32. Solder 31 and solder 32 are formed of a solder material with excellent wettability of copper, such as a Sn/Ag-based material mainly composed of tin (Sn) and silver (Ag), a Sn/Cu-based material mainly composed of tin and copper, and a Sn/Bi-based material such as tin and bismuth (Bi). Although the material of solder 31, 32 including lead (Pb) achieves the effect of the present invention, solder including lead is not environmentally friendly and thus not preferable.

Since electrode plate 63 of first lead frame 60 is formed of aluminum or aluminum alloy, solder 31, 32 does not wet or spread on electrode plate 63 and is not absorbed by electrode plate 63 during soldering. As a result, there is no shortage of solder used for joining metal members 61, 62 and semiconductor elements 21, 22, and metal members 61, 62 and semiconductor elements 21, 22 are joined with a sufficient amount of solder 31, 32.

The front electrodes of semiconductor elements 21, 22 have a size of, for example, 12 mm×12 mm, and the joints surfaces of metal members 61, 62 to front electrodes 33, 34 of semiconductor elements 21, 22 have a size of, for example, 8 mm×8 mm. That is, as shown in FIG. 1, the entire metal members 61, 62 are positioned inside of the outer peripheries of front electrodes 33, 34 of semiconductor elements 21, 22 in a two-dimensional view, and metal members 61, 62 have an area smaller than front electrodes 33, 34 of semiconductor elements 21, 22 in a two-dimensional view. Metal members 61, 62 are smaller than the area of electrode plate 63 in a two-dimensional view.

Therefore, since the solder joint surfaces of metal members 61, 62 are positioned inside of the outer peripheries of front electrodes 33, 34 of semiconductor elements 21, 22 and have an area smaller than front electrodes 33, 34 of semiconductor elements 21, 22, solder 31, 32 has a fillet shape so as to be flared toward front electrodes 33, 34 of semiconductor elements 21, 22. At the protrusions protruding from the surface of electrode plate 63, metal members 61, 62 are solder-joined to semiconductor elements 21, 22 at the bottom surfaces of the protrusions opposed to the front electrodes of semiconductor elements 21, 22 and the side surfaces of the protrusions provided between the bottom surfaces and the electrode plate. This increases the joint area between metal members 61, 62 and solder 31, 32. Thus, the solder joint portions are highly visible in a test after first lead frame 60 is solder-joined to semiconductor elements 21, 22 with solder 31, 32, and the joint stress by solder 31, 32 is distributed, thereby increasing the reliability of the solder joint portions.

The back electrodes of semiconductor elements 21, 22 and conductor layer 11 of insulating substrate 10 may be joined, instead of solder, using a conductive adhesive including silver (Ag) filler dispersed in epoxy resin or a metal nanoparticle bonding material in which metal nanoparticles of Ag, Cu, etc. are baked at low temperatures for joining. Alternatively, a conductive adhesive or a metal nanoparticle bonding material may be used for least one of the joining between front electrode 33 of semiconductor element 21 and metal member 61 or the joining between front electrode 34 of semiconductor element 22 and metal member 62. Since electrode plate 63 formed of aluminum or aluminum alloy has a native oxide film on its surface, the joining with a conductive adhesive or a metal nanoparticle bonding material does not provide high electrical conductivity. By contrast, since metal members 61, 62 are formed of copper or copper alloy, the native oxide film is porous and relatively easily broken, and a fresh surface is easily formed. Therefore, the electrical resistance at the joint portion can be reduced even with the joining using a conductive adhesive or a metal nanoparticle bonding material.

First lead frame 60 has a main terminal 64 at an end portion on the opposite side to the side having metal members 61, 62, and main terminal 64 is fixed to case 50. Main terminal 64 has a screw hole for attaching an external wiring member by a screw, in the same manner as main terminal 65. Main terminal 64 has, for example, a width of 10 mm and a thickness of 0.6 mm and may be plated with copper or nickel, if necessary. With the configuration described above, main terminal 65 and main terminal 64 are electrically connected through conductor layer 11, semiconductor elements 21, 22, and first lead frame 60 to allow main circuit current to flow between main terminal 65 and main terminal 64.

Second lead frame 67 is formed of copper or copper alloy or aluminum or aluminum alloy and is fixed to case 50. One end of second lead frame 67 is exposed on the outside of semiconductor device 100 to serve as a control terminal for input of a control signal. When second lead frame 67 is formed of aluminum or aluminum alloy, the portion of the control terminal exposed on the outside of semiconductor device 100 may be plated with copper or nickel to improve solder wettability.

The other end of second lead frame 67 is electrically connected to a control electrode 23 provided on the front surface side of semiconductor element 22 through wire 40. Wire 40 may be, for example, aluminum wire, copper wire coated with aluminum, or gold wire with a diameter of 0.15 mm and ultrasonic-welded to second lead frame 67 and control electrode 23 by wire bonding. The second lead frame and control electrode 23 may be electrically connected through ribbon bond or busbar that is an ultrasonic-welded metal plate, instead of wire bonding.

Case 50 is formed in a frame shape of PPS (Poly Phenylene Sulfide) resin or LCP (Liquid Crystal Polymer) resin. For example, the outer dimensions are 48 mm×28 mm and the height is 12 mm. Insulating substrate 10 is provided at the bottom of case 50 and conductor layer 13 is exposed on the outside of semiconductor device 100. Insulating substrate 10 is adhesively fixed to case 50 by an adhesive material 80 provided on the periphery of insulating substrate 10.

Sealing resin portion 70 is formed of potting resin and covers conductor layer 11, semiconductor elements 21, 22, first lead frame 60, second lead frame 67, wire 40, and solder 31, 32 to provide insulation sealing. The sealing resin that forms sealing resin portion 70 is not limited to potting resin and may be any material that provides insulation and is pourable and curable at room temperatures, for example, liquid gel. Semiconductor device 100 is configured as described above.

A method of manufacturing semiconductor device 100 will now be described.

Figure 3:
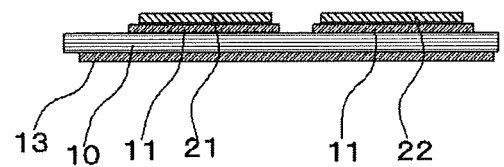
FIG. 3 is a cross-sectional view showing a method of manufacturing a semiconductor device in the first embodiment of the present invention.
Figure 3:
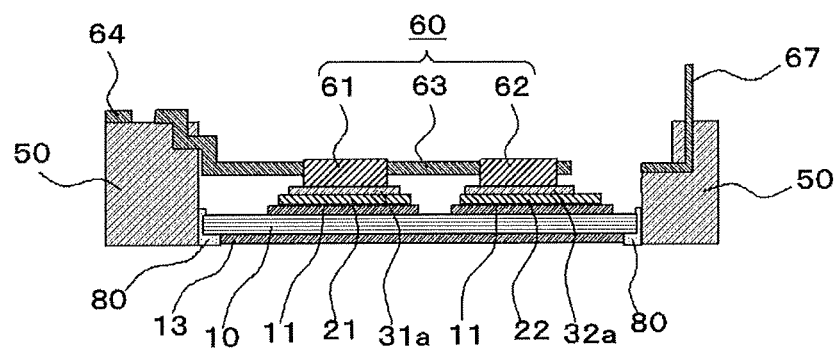
Figure 3:
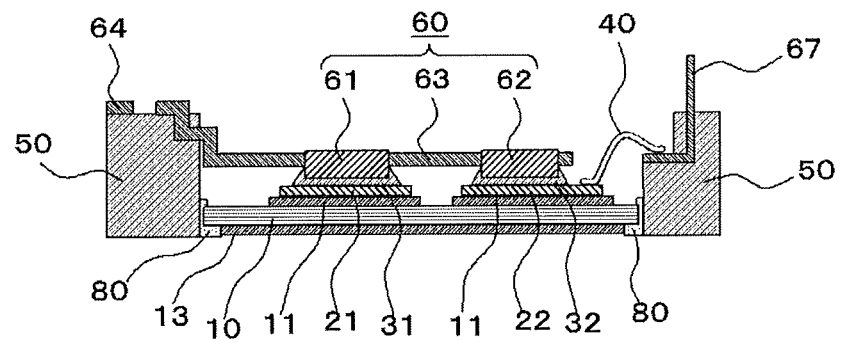
Figure 3:
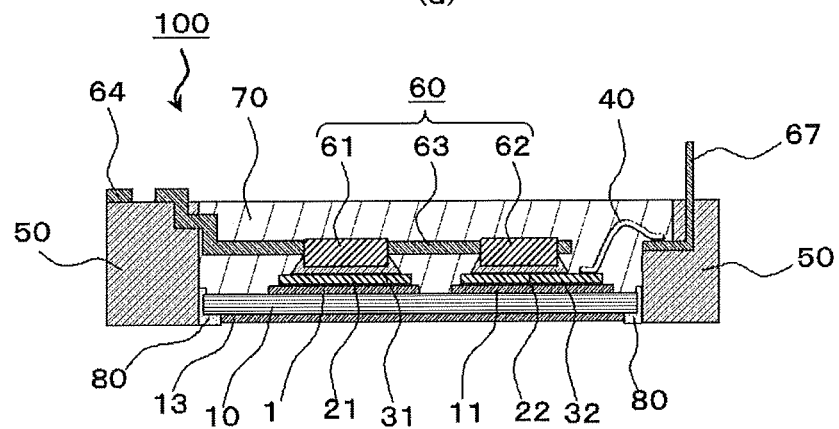

FIG. 3 is a cross-sectional view showing a method of manufacturing a semiconductor device in the first embodiment of the present invention. FIG. 3(a) is a diagram showing the process up to joining of semiconductor elements 21, 22 to insulating substrate 10, and FIG. 3(b) is a diagram showing the process up to placement of plate solder 31a, 32a between the front electrodes of semiconductor elements 21, 22 and metal members 61, 62 of first lead frame 60. FIG. 3(c) is a diagram showing the process up to solder joining between the front electrodes of semiconductor elements 21, 22 and metal members 61, 62 of first lead frame 60 to electrically connect the control electrode of semiconductor element 22 with second lead frame 67, and FIG. 3(d) is a diagram showing the process up to formation of sealing resin portion 70 to complete semiconductor device 100.

First of all, as shown in FIG. 3(a), the back electrodes of semiconductor element 21 and semiconductor element 22 are joined to conductor layer 11 of insulating substrate 10 to which conductor layer 11 is joined on the front surface side and conductor layer 13 is joined on the back surface side. The back electrodes of semiconductor elements 21, 22 and conductor layer 11 may be joined with solder or may be joined with a metal nanoparticle bonding material. In the case of joining with solder, solder having a melting point higher than that of solder 31, 32 for joining the front electrodes of semiconductor elements 21, 22 and first lead frame 60 is preferably used so that heating in the process of solder-joining the front electrodes of semiconductor elements 21, 22 and first lead frame 60 shown in FIG. 3(c) does not remelt the solder.

Next, as shown in FIG. 3(b), insulating substrate 10 having semiconductor elements 21, 22 joined thereto is arranged at the bottom of the frame-shaped case 50, and silicone adhesive material 80 is filled between the periphery of insulating substrate 10 and case 50 for adhesive fixing. Adhesive material 80 filling the gap between insulating substrate 10 and case 50 can prevent leakage of a potting material filled in case 50 in the process of forming sealing resin portion 70 shown in FIG. 3(d).

Case 50 is provided with first lead frame 60 including electrode plate 63 and metal members 61, 62, terminal plate 66, and second lead frame 67 by insert molding beforehand. At the top of case 50, main terminal 64 provided at an end of first lead frame 60 and main terminal 65 provided at an end of terminal plate 66 are fixed. The method of fastening metal members 61, 62 to electrode plate 63 will be described later.

When insulating substrate 10 is inserted at a predetermined position of case 50, first lead frame 60 is fixed to case 50 such that the joint surfaces of metal members 61, 62 are opposed to the front electrodes of semiconductor elements 21, 22 joined to insulating substrate 10, and second lead frame 67 is fixed to case 50 such that the wire bonding portion is positioned at the position corresponding to the control electrode of semiconductor element 22 joined to insulating substrate 10.

Plate solder 31a, 32a is arranged between the front electrodes of semiconductor elements 21, 22 joined to insulating substrate 10 and metal members 61, 62 of first lead frame 60, and the periphery of insulating substrate 10 is adhesively fixed to case 50 with adhesive material 80.

Next, as shown in FIG. 3(c), plate solder 31a, 32a arranged between the front electrodes of semiconductor elements 21, 22 and metal members 61, 62 of first lead frame 60 is melted and solidified for solder joint with solder 31, 32. The control electrode of semiconductor element 22 and second lead frame 67 are electrically connected through wire 40, and terminal plate 66 is joined to conductor layer 11 provided on insulating substrate 10.

Plate solder 31a, 32a arranged between the front electrodes of semiconductor elements 21, 22 and metal members 61, 62 of first lead frame 60 is heated by a reflow furnace or a hot plate to be melted. Solder that melts at temperatures lower than the melting point of the bonding material joining semiconductor elements 21, 22 to conductor layer 11 on insulating substrate 10 is used as plate solder 31a, 32a and heated to temperature at which the bonding material between conductor layer 11 and the back electrodes of semiconductor elements 21, 22 is not remelted.

The melted solder 31, 32 wets the front electrodes of semiconductor elements 21, 22 and also wets metal members 61, 62 of first lead frame 60. Since metal members 61, 62 are positioned inside of the outer peripheries of the front electrodes of semiconductor elements 21, 22 in a two-dimensional view and have an area smaller than the front electrodes of semiconductor elements 21, 22 in a two-dimensional view, as shown in FIG. 3(c), fillets are formed in a flare shape with a small contact angle to the front electrodes of semiconductor elements 21, 22 and in a shape that spreads on not only the bottom surfaces but also the side surfaces of the protrusions of metal members 61, 62 of first lead frame 60.

Since electrode plate 63 of first lead frame 60 is formed of aluminum or aluminum alloy, the melted solder 31, 32 does not wet electrode plate 63 and the melted solder 31, 32 does not spread on electrode plate 63. Therefore, solder 31, 32 is not absorbed by electrode plate 63, so that a predetermined amount of solder 31, 32 is kept between semiconductor elements 21, 22 and metal members 61, 62 of first lead frame 60, and there is no shortage of solder for solder joint. In addition, since metal members 61, 62 have an area smaller than the front electrodes of semiconductor elements 21, 22 in a two-dimensional view, solder does not wet and spread on the surfaces of metal members 61, 62 more than necessary, and there is no shortage of solder for solder joint.

Subsequently, the melted solder 31, 32 is cooled into solidified solder 31, 32, whereby the front electrodes of semiconductor elements 21, 22 and metal members 61, 62 are joined with solder. Since solder 31, 32 is provided only between semiconductor elements 21, 22 and metal members 61, 62 and does not spread to electrode plate 63 having an area larger than the front electrodes of semiconductor elements 21, 22 in a two-dimensional view, a sufficient amount of solder is present between the front electrodes of semiconductor elements 21, 22 and metal members 61, 62 to provide a strong and reliable solder joint.

The surfaces opposed to the front electrodes of semiconductor elements 21, 22 to form the joint surfaces of metal members 61, 62 may be planar or may be surfaces with protrusions or surfaces having a pointed shape, or may be curved surfaces protruding toward the front electrodes of semiconductor elements 21, 22.

The control electrode of semiconductor element 22 and second lead frame 67 are joined by ultrasonic welding by wire bonding. That is, wire 40 is used to electrically connect the control electrode of semiconductor element 22 with second lead frame 67. Terminal plate 66 and conductor layer 11 provided on insulating substrate 10 are joined by ultrasonic welding. The bonding by ultrasonic welding may be performed before or after solder joining between the front electrodes of semiconductor elements 21, 22 and metal members 61, 62 of first lead frame 60. Semiconductor elements 21, 22 are electrically connected between main terminal 64 and main terminal 65 of semiconductor device 100 by solder joining and ultrasonic welding described above.

Next, as shown in FIG. 3(*d*), sealing resin portion 70 is formed with potting resin in case 50 to seal case 50 in an insulated manner. Potting resin heated to 60° C. is poured into case 50 and defoamed under vacuum and heated at 100° C. for 1.5 hours, followed by heating at 140° C. for 1.5 hours to cure the potting resin, thereby forming sealing resin portion 70. Semiconductor device 100 is completed through the processes described above.

A method of producing the first lead frame will now be described.

Figure 4:
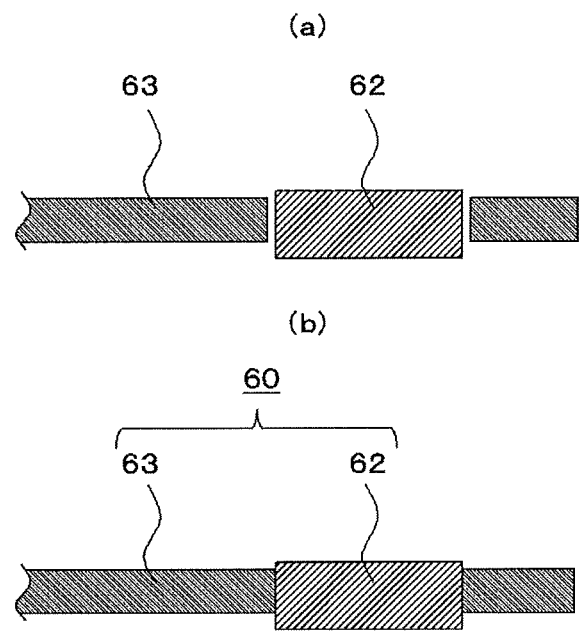
FIG. 4 is a partial cross-sectional view showing a method of producing a first lead frame of the semiconductor device in the first embodiment of the present invention.

FIG. 4 is a partial cross-sectional view showing a method of producing the first lead frame of the semiconductor device in the first embodiment of the present invention. FIG. 4 shows metal member 62 and the neighboring electrode plate 63 of first lead frame 60 and shows a method of fastening metal member 62 and electrode plate 63 by shrink fitting. FIG. 4(*a*) is a diagram showing a state in which the area of the opening formed in electrode plate 63 is increased by heating electrode plate 63, and FIG. 4(*b*) shows a state in which the opening formed in electrode plate 63 is shrunken by cooling electrode plate 63 so that metal member 62 and electrode plate 63 are fastened by shrink fitting. Although FIG. 4 does not show metal member 61, metal member 61 is also fastened to electrode plate 63 by the same process as metal member 62.

First of all, an opening is formed in electrode plate 63 of aluminum or aluminum alloy by pressing or the like. Metal member 62 made of a solder-wettable metal material, such as copper or copper alloy, is formed by pressing or the like. When metal member 62 is formed, for example, with outer dimensions of 8 mm×8 mm and a thickness of 1 mm as described above, the opening formed in electrode plate 63 has a size slightly smaller than 8 mm×8 mm, for example, 7.99 mm×7.99 mm.

Next, as shown in FIG. 4(*a*), electrode plate 63 is heated and the opening formed in electrode plate 63 is expanded by thermal expansion. For example, when electrode plate 63 is formed of aluminum and metal member 62 is formed of copper, the linear thermal expansion coefficient of aluminum is 23 ppm/K and the linear thermal expansion coefficient of copper is 16 ppm/K. When the temperature of metal member 62 is set to room temperature (for example, 25° C.) and the temperature of electrode plate 63 is increased to, for example, a temperature (for example, 350° C.) 325 K higher than the temperature of metal member 62, the size of the opening of electrode plate 63 increases by about 0.75% to approximately 8.05 mm×8.05 mm, which is larger than the outer size 8 mm×8 mm of metal member 62. Therefore, as shown in FIG. 4(*a*), metal member 62 can be fitted in the opening of electrode plate 63.

Next, as shown in FIG. 4(*b*), with metal member 62 fitted in the opening of electrode plate 63, electrode plate 63 is cooled so that the temperature of electrode plate 63 is equal to the temperature of metal member 62. When electrode plate 63 is cooled, the opening formed in electrode plate 63 becomes smaller, so that electrode plate 63 comes into intimate contact with metal member 62, and metal member 62 inserted in the opening of electrode plate 63 is fastened. That is, electrode plate 63 is fastened to metal member 62. The opening of electrode plate 63 is smaller than the outer dimensions of metal member 62. However, when electrode plate 63 is cooled, the opening of electrode plate 63 and metal member 62 are deformed and come into intimate contact with each other to form first lead frame 60. Aluminum which is light weight compared with copper can be used as an electrode plate by a simple process.

Since first lead frame 60 formed as described above has a difference in linear thermal expansion coefficient between metal member 62 formed of copper and electrode plate 63 formed of aluminum, the size of the opening of electrode plate 63 may become larger than the outer dimensions of metal member 62 when the temperature of the first lead frame is increased by Joule heat produced by main circuit current flowing through semiconductor device 100 or heat generated by semiconductor elements 21, 22. In the example described above, when the temperature of first lead frame 60 is increased 180 K higher than room temperature (for example 25° C.) (for example, reaches 205° C.), the size of the opening of electrode plate 63 becomes equal to the outer dimensions of metal member 62, and the intimate contact between electrode plate 63 and metal member 62 starts decreasing. However, when the temperature of first lead frame 60 is equal to or lower than 200° C., electrode plate 63 and metal member 62 are in intimate contact to provide good electrical conduction with low electrical resistance. When the temperature of the first lead frame is equal to or higher than 200° C., the size of the opening formed in electrode plate 63 is further reduced. As described above, first lead frame 60 can be produced by shrink fitting.

First lead frame 60 thus produced is formed such that metal members 61, 62 and electrode plate 63 are fastened in contact with each other without a bonding material. First lead frame 60 is therefore excellent in electrical conduction and thermal conduction and free from corrosion or separation of a bonding material to achieve high reliability.

Figure 5:
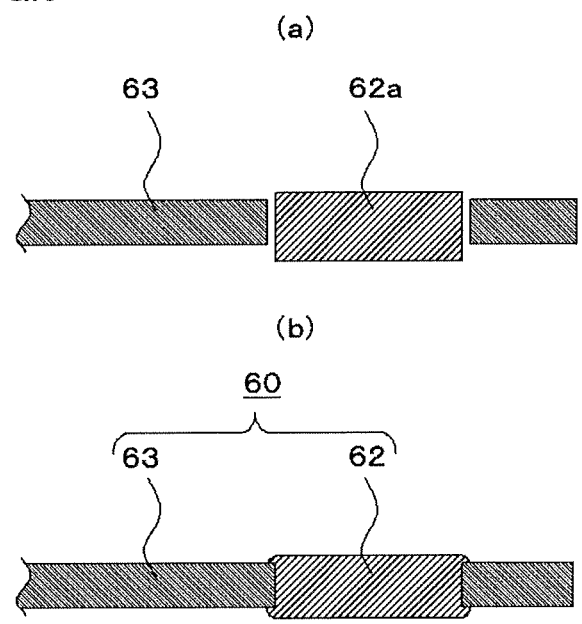
FIG. 5 is a partial cross-sectional view showing another method of producing a first lead frame of the semiconductor device in the first embodiment of the present invention.

Another method of producing the first lead frame will now be described. FIG. 5 is a partial cross-sectional view showing another method of producing the first lead frame of the semiconductor device in the first embodiment of the present invention. Similar to FIG. 4, FIG. 5 shows metal member 62 and the neighboring electrode plate 63 of first lead frame 60 and shows the method of fastening metal member 62 and electrode plate 63 by pressing metal member 62. FIG. 5(*a*) shows a state in which metal member 62*a* slightly smaller than the opening is fitted in the opening formed in electrode plate 63, and FIG. 5(*b*) is a diagram showing a state in which metal member 62 and electrode plate 63 are fastened by pressing metal member 62*a* to increase the outer dimensions. Although FIG. 5 does not show metal member 61 as in FIG. 4, metal member 61 is also fastened to electrode plate 63 by the same process as metal member 62.

First of all, as shown in FIG. 5(*a*), an opening is formed in electrode plate 63, and a metal member 62*a* having outer dimensions smaller than the opening of electrode plate 63 is formed by pressing or the like. For example, when the opening of electrode plate 63 has a size of 8 mm×8 mm, metal member 62a may be formed with outer dimensions of 7.9 mm×7.9 mm and a thickness of 1 mm. Metal member 62a is then fitted in the opening of electrode plate 63.

Next, as shown in FIG. 5(b), pressure is applied in a thickness direction of metal member 62a by pressing to crush metal member 62a. As a result, metal member 62 formed by crushing metal member 62a has a larger outer dimension vertical to the thickness direction, and metal member 62 inserted in the opening of electrode plate 63 is fastened. First lead frame 60 is thus completed. Metal member 62 and electrode plate 63 are in intimate contact and thus achieve good electrical conduction with small electrical resistance. As described above, first lead frame 60 can be produced by pressing.

First lead frame 60 thus produced is formed such that metal members 61, 62 and electrode plate 63 are fastened in contact with each other without a bonding material, in the same manner as production by shrink fitting. First lead frame 60 is thus excellent in electrical conduction and heat conduction and free from corrosion or separation of a bonding material and thus achieves high reliability.

Figure 6:
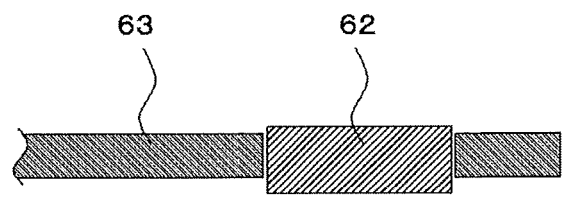
FIG. 6 is a partial cross-sectional view showing yet another method of producing a first lead frame of the semiconductor device in the first embodiment of the present invention.
Figure 6:
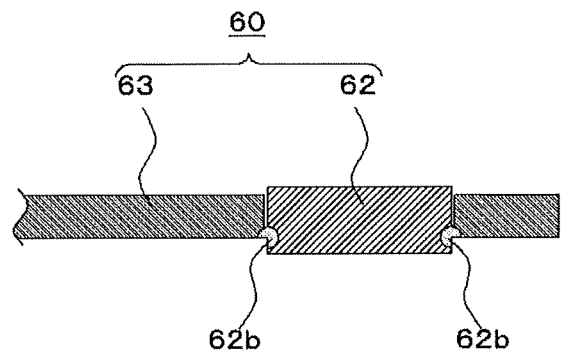

FIG. 6 is a partial cross-sectional view showing yet another method of producing the first lead frame of the semiconductor device in the first embodiment of the present invention. Similar to FIG. 4, FIG. 6 shows metal member 62 and the neighboring electrode plate 63 of first lead frame 60 and shows a method of joining metal member 62 and electrode plate 63 by laser welding. FIG. 6(a) is a diagram showing a state in which metal member 62 slightly smaller than the opening is fitted in the opening formed in electrode plate 63, and FIG. 6(b) is a diagram showing a state in which metal member 62 and electrode plate 63 are fastened by laser welding. Although FIG. 6 does not show metal member 61 as in FIG. 4, metal member 61 is also fastened to electrode plate 63 by the same process as metal member 62.

First of all, as shown in FIG. 6(a), an opening is formed in electrode plate 63, and metal member 62 having outer dimensions smaller than the opening formed in electrode plate 63 is formed. For example, when the opening of electrode plate 63 has a size of 8 mm×8 mm, metal member 62a may be formed with outer dimensions of 7.9 mm×7.9 mm and a thickness of 1 mm. Metal member 62 is then fitted in the opening of electrode plate 63.

Next, as shown in FIG. 6(b), laser light is applied to the joint portion between electrode plate 63 and metal member 62 for laser welding. As a result, welding bead 62b of copper and aluminum alloy is formed at the joint portion between electrode plate 63 and metal member 62, and metal member 62 is fastened to electrode plate 63. First lead frame 60 is thus completed. Since metal member 62 is joined and fastened to electrode plate 63, good electrical conduction with low electrical resistance can be achieved. As described above, first lead frame 60 can be produced by laser welding. Thermal treatment promotes metal diffusion between electrode plate 63 and metal member 62 to increase electrical conduction and heat conduction or mechanical strength. In this case, a joint portion involving metal diffusion is formed at least partially between metal member 62 and electrode plate 63.

As described above, first lead frame 60 can be produced by inserting and fastening metal members 61, 62 in the openings of electrode plate 63 by shrink fitting, pressing, or laser welding. However, the method of producing first lead frame 60 is not limited to the methods described above. For example, metal members 61, 62 may be fastened to electrode plate 63 by joining metal members 61, 62 to electrode plate 63 with no opening. Metal members 61, 62 may be joined and fastened to electrode plate 63, for example, by performing ultrasonic welding by applying load while applying ultrasound, by thermocompression bonding by applying load while heating to a temperature equal to or higher than the recrystallization temperature of aluminum, or by friction stir welding. The area of electrode plate 63 is larger than the area of metal members 61, 62 in a two-dimensional view. That is, the area of the surface disposed parallel to the front electrode of the semiconductor element is larger in electrode plate 63 that in metal members 61, 62.

When metal members 61, 62 are formed of copper or copper alloy, the surfaces of metal members 61, 62 may be metallized by solder coating or Ni/Au plating for preventing rust. When metal members 61, 62 and the front electrodes of semiconductor elements 21, 22 are joined with solder, the metal films formed on the surfaces of metal members 61, 62 by such metallization are melted into solder and are not left on the surfaces of metal members 61, 62 after solder joining, and the metal element used in metallization is detected in solder.

The operation effect of semiconductor device 100 will now be described.

As described above, in semiconductor device 100 of the present invention, first lead frame 60 is formed such that electrode plate 63 made of aluminum or aluminum alloy and not wettable by solder because of a native oxide film on its surface is fastened to metal members 61, 62 made of a solder-wettable metal such as copper or copper alloy. Therefore, even when solder is disposed between the front electrodes of semiconductor elements 21, 22 and metal members 61, 62 and melted for electrically connecting the front electrodes of semiconductor elements 21, 22 with first lead frame 60, the melted solder wets only the front electrodes of semiconductor elements 21, 22 and the surfaces of metal members 61, 62. In other words, the melted solder fails to wet and spread on electrode plate 63 formed of aluminum or aluminum alloy. That is, the amount of solder necessary for solder joint can be reduced because solder wets only the surfaces of metal members 61, 62 having an area smaller than the front electrodes of semiconductor elements 21, 22 in a two-dimensional view and solder does not wet or spread on electrode plate 63 having an area larger than the front electrodes of semiconductor elements 21, 22 in a two-dimensional view.

As a result, the amount of solder necessary for joining the front electrodes of semiconductor elements 21, 22 and metal members 61, 62 is kept between the front electrodes of semiconductor elements 21, 22 and metal members 61, 62, and the front electrodes of semiconductor elements 21, 22 and metal members 61, 62 are solder-joined with a sufficient amount of solder 31, 32. This can prevent an open failure between the front electrodes of semiconductor elements 21, 22 and first lead frame 60. In addition, since the region wetted by the solder heated and melted is limited on the front electrodes of semiconductor elements 21, 22 and on the surfaces of metal members 61, 62, the amount of solder 31, 32 provided at the solder joint portion between the front electrodes of semiconductor elements 21, 22 and metal members 61, 62 can be reduced to the adequate amount, thereby reducing stress applied by solder 31, 32 on the front electrodes of semiconductor elements 21, 22.

Since main circuit current flowing through semiconductor device 100 is large current, for example, a few tens of amperes or higher, a ceramic substrate formed of ceramic with high thermal conductivity, such as aluminum nitride (AlN), is used for insulating substrate 10 that is disposed on the bottom of semiconductor device 100 for efficiently dissipating heat generated in semiconductor device 100, such as heat generated by semiconductor elements 21, 22 and is joined to the back electrodes of semiconductor elements 21, 22. First lead frame 60 is joined to the front electrodes of semiconductor elements 21, 22 directly with solder. In this configuration, thermal stress generated due to the difference between the linear thermal expansion coefficient of the member joined to the front electrode and the back electrode and the linear thermal expansion coefficient of the semiconductor element is applied to the front electrodes and the back electrodes of semiconductor elements 21, 22.

When electrode plate 63 of first lead frame 60 is formed of aluminum, the linear thermal expansion coefficient is 23 ppm/K. When metal members 61, 62 are formed of copper, the linear thermal expansion coefficient is 16 ppm/K. The linear thermal expansion coefficient of semiconductor elements 21, 22 is 3 to 3.5 ppm/K when semiconductor elements 21, 22 are made of Si, 4.2 to 4.7 ppm/K when they are made of SiC, and 3.2 to 5.6 ppm/K when they are made of GaN. Since GaN is anisotropic, the value of linear thermal expansion coefficient greatly varies with direction. Furthermore, the linear thermal expansion coefficient of aluminum nitride insulating substrate 10 to which semiconductor elements 21, 22 are joined is about 10 ppm/K as a whole including conductor layer 11 and conductor layer 13 provided on both surfaces of insulating substrate 10.

The difference in linear thermal expansion coefficient between semiconductor elements 21, 22 and aluminum electrode plate 63 or copper metal members 61, 62 on the front electrode side is larger than that of insulating substrate 10 on the back electrode side. Therefore, compared with when the entire first lead frame is formed with an aluminum electrode plate, the aluminum electrode plate is plated with copper, and the electrode plate and the front electrodes of semiconductor elements are joined with solder, thermal stress applied to the front electrodes of semiconductor elements 21, 22 can be reduced when first lead frame 60 is formed with aluminum electrode plate 63 fastened to copper metal members 61, 62, and metal members 61, 62 and the front electrodes of semiconductor elements 21, 22 are joined with solder, as in semiconductor device 100 of the present invention. This can increase the reliability of semiconductor elements 21, 22.

When semiconductor elements 21, 22 are formed of silicon carbide (SiC), semiconductor elements 21, 22 may be continuously used at temperatures exceeding 200° C. In a semiconductor device in which the first lead frame is formed only with an electrode plate formed of aluminum with copper plating, and the electrode plate and the front electrode of the semiconductor element are joined with solder, the continuous use of the semiconductor element at temperatures exceeding the recrystallization temperature of aluminum, for example, 200° C., increases the coarseness of crystal grains of aluminum of the electrode plate of the first lead frame to cause cracking or separation of the copper plating film applied on the electrode plate, thereby reducing the reliability of the solder joint portion between the electrode plate and the front electrode of the semiconductor element.

However, in semiconductor device 100 of the present invention, first lead frame 60 is configured such that electrode plate 63 of aluminum or aluminum alloy is fastened to metal members 61, 62 with the solder joint portion of copper or copper alloy. Therefore, metal members 61, 62 have higher heat resistance compared with aluminum, and the reliability of the solder joint portion between the front electrodes of semiconductor elements 21, 22 and metal members 61, 62 is sufficiently high even in continuous use of semiconductor elements 21, 22 at temperatures exceeding 200° C.

In a conventional semiconductor device, when the first lead frame is formed with an electrode plate of aluminum or aluminum alloy, the electrode plate is plated with copper to allow solder to wet the electrode plate. However, plating on aluminum or aluminum alloy requires a high degree of expertise and, consequently, the electrode plate formed of aluminum or aluminum alloy requires costs equivalent to or higher than the electrode plate formed of copper or copper alloy. Furthermore, copper of the thin copper plating film dissolves into the melted solder during soldering, which is called solder leaching, or the copper plating film peels off during use of the semiconductor device. Thus, it has been difficult to ensure high reliability of the solder joint portion.

However, in semiconductor device 100 of the present invention, first lead frame 60 is configured such that electrode plate 63 of aluminum or aluminum alloy and metal members 61, 62 made of a solder-wettable metal such as copper or copper alloy are fastened to each other. In this configuration, first lead frame 60 can be manufactured at low costs, and metal members 61, 62 are free from peeling or solder leaching, thereby ensuring high reliability of the solder joint portion.

Second Embodiment

Figure 7:
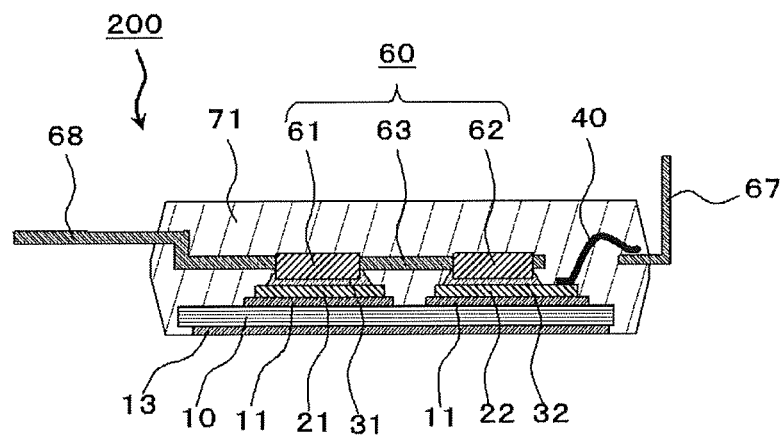
FIG. 7 is a cross-sectional view showing a semiconductor device in a second embodiment of the present invention.

FIG. 7 is a cross-sectional view showing a semiconductor device in a second embodiment of the present invention. In FIG. 7, the same signs denote the same or corresponding components as in FIG. 1 and FIG. 2 and a description thereof is not repeated. The second embodiment differs from the first embodiment of the present invention in that a semiconductor device 200 does not include a case or a sealing resin portion and is sealed by transfer molding using a mold resin.

As shown in FIG. 7, semiconductor device 200 includes first lead frame 60 configured such that metal members 61, 62 made of a solder-wettable material such as copper or copper alloy and electrode plate 63 of aluminum or aluminum alloy are fastened to each other. Metal members 61, 62 are joined with solder to the front electrodes of semiconductor elements 21, 22 joined to insulating substrate 10.

Electrode plate 63 of first lead frame 60 has a main terminal portion 68 connected to an external electric circuit at an end on the opposite side to the side on which metal members 61, 62 are fastened. Main terminal portion 68 is exposed on the outside of semiconductor device 200 and is metallized with a solder-wettable metal, such as nickel plating and copper plating, if necessary. Furthermore, a terminal plate (not shown) is joined to conductor layer 11 on insulating substrate 10, and a main terminal portion (not shown) connected to an external electric circuit is provided on an end of the terminal plate on the opposite side to the side joined to conductor layer 11.

The components of semiconductor device 200 are sealed by a sealing resin portion 71 by transfer molding. Conductor layer 13 provided on the back surface side of insulating substrate 10 is exposed on the outside of sealing resin portion 71, and conductor layer 13 is configured to be joined to a heatsink (not shown) for heat dissipation with a bonding material such as solder.

Also in semiconductor device 200 configured as described above, first lead frame 60 is configured such that electrode plate 63 of aluminum or aluminum alloy is fastened to metal members 61, 62 joined to the front electrodes of semiconductor elements 21, 22 with solder, positioned inside of the outer peripheries of the front electrodes of semiconductor elements 21, 22 in a two-dimensional view, and having an area smaller than the front electrodes of semiconductor elements 21, 22 and electrode plate 53. In this configuration, solder 31, 32 does not wet or spread on electrode plate 63 and solder 31, 32 is not absorbed by electrode plate 63, so that a sufficient amount of solder can be kept for joining the front electrodes of semiconductor elements 21, 22 and metal members 61, 62, thereby achieving the similar effects as in the first embodiment.

Third Embodiment

Figure 8:
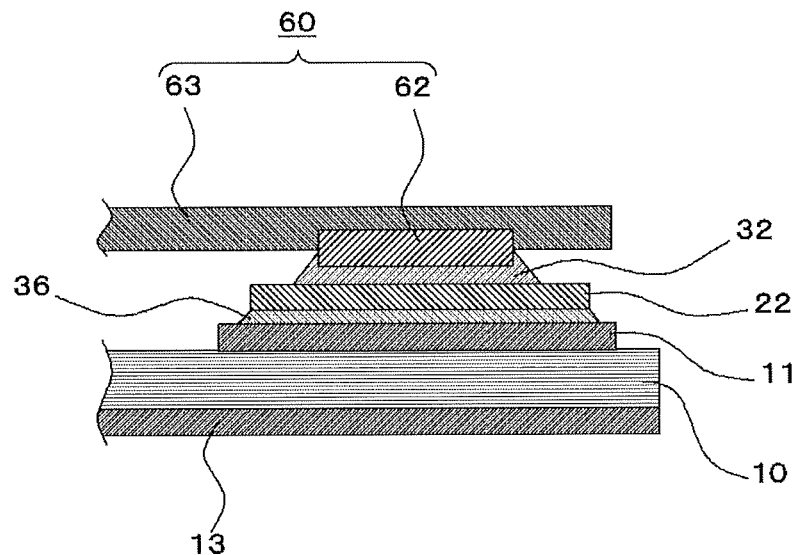
FIG. 8 is a partial cross-sectional view showing a configuration of the solder joint portion between the first lead frame and the front electrode of the semiconductor element in a semiconductor device in a third embodiment of the present invention.

FIG. 8 is a partial cross-sectional view showing a configuration of the solder joint portion between the first lead frame and the front electrode of the semiconductor element in a semiconductor device in a third embodiment of the present invention. Although FIG. 8 shows a configuration of the solder joint portion between semiconductor element 22 and metal member 62, the solder joint portion between semiconductor element 21 and metal member 61 has a similar configuration. In FIG. 8, the same signs as in FIG. 1 and FIG. 2 denote the same or corresponding components and a description thereof will not be repeated. The third embodiment differs from the first embodiment of the present invention in the structure for fastening electrode plate 63 and metal member 62 of first lead frame 60.

As shown in FIG. 8, in the semiconductor device of the present third embodiment, the back electrode of semiconductor element 22 is joined with a bonding material 36 such as solder to conductor layer 11 provided on the front surface side of insulating substrate 10, and first lead frame 60 is joined to the front electrode of semiconductor element 22 with solder 32. First lead frame 60 is configured with metal member 62 joined to the front electrode of semiconductor element 22 with solder 32 and electrode plate 63 fastened to metal member 62. Electrode plate 63 is electrically connected to the front electrode of semiconductor element 22 through metal member 62.

As shown in FIG. 8, electrode plate 63 of aluminum or aluminum alloy has an opening which is a blind hole recessed from the surface of electrode plate 63, and metal member 62 is inserted into the opening that is a blind hole provided in electrode plate 63, whereby electrode plate 63 and metal member 62 are fastened to each other. Metal member 62 and electrode plate 63 can be fastened to each other by joining electrode plate 63 and metal member 62 by shrink fitting or heat crimping.

Figure 9:
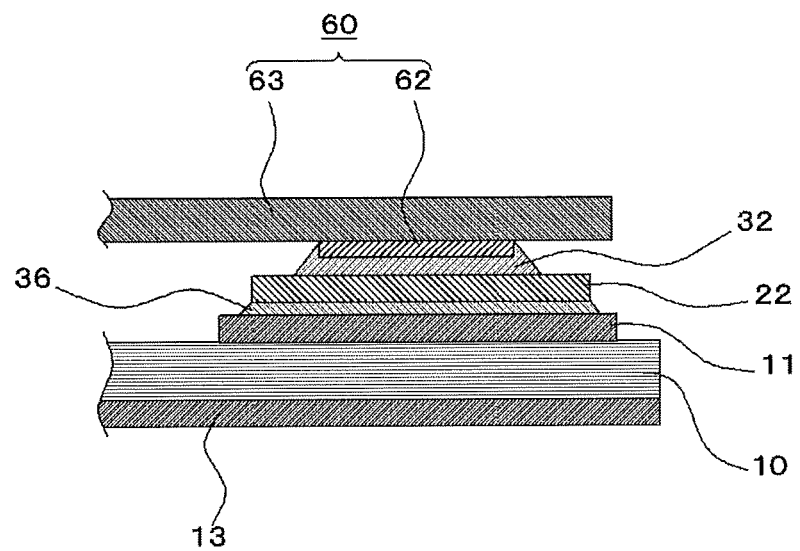
FIG. 9 is a partial cross-sectional view showing another configuration of the solder joint portion between the first lead frame and the front electrode of the semiconductor element in the semiconductor device in the third embodiment of the present invention.

FIG. 9 is a partial cross-sectional view showing another configuration of the solder joint portion between the first lead frame and the front electrode of the semiconductor element in the semiconductor device in the third embodiment of the present invention. In FIG. 9, the same signs as in FIG. 8 denote the same or corresponding components and a description thereof will not be repeated. The configuration differs from that in FIG. 8 in that metal member 62 is joined and fastened to the surface of electrode plate 63 of first lead frame 60.

As shown in FIG. 9, metal member 62 formed of a solder-wettable metal such as copper or copper alloy is affixed and fastened to the surface of electrode plate 63 of aluminum or aluminum alloy. That is, the entire metal member 62 is a protrusion protruding from the surface of electrode plate 63. Metal member 62 can be affixed and fastened to electrode plate 63 by ultrasonic welding. Alternatively, metal member 62 may be formed on the surface of electrode plate 63 through a film-forming process such as plating or printing.

When metal member 62 is thin, the metal material, such as copper, forming metal member 62 dissolves into the melted solder when jointed to the front electrode of semiconductor element 22 with solder, which is called solder leaching. Thus, metal member 62 may partially disappear and the solder joint strength may be reduced. Therefore, metal member 62 need to have a thickness that does not disappear due to solder leaching. That is, the thickness of metal member 62 is equal to or greater than 10 µm, preferably equal to or greater than 50 µm. Metal member 62 is preferably formed of a metal plate or a metal foil to be joined to electrode plate 63, rather than being formed by a film-forming process such as plating. Therefore, for easiness of handling in joining metal member 62, the thickness of metal member 62 is further preferably equal to or greater than 100 µm. The thickness of metal member 62 is equal to or greater than 10 µm, preferably equal to or greater than 50 µm, further preferably equal to or greater than 100 µm, not only in the semiconductor device having a configuration shown in FIG. 9 but also in the configurations of the semiconductor device illustrated in all the embodiments of the present invention. When the metal member is formed by stacking a plurality of metal layers, the thickness of the metal layer having a joint surface joined to the front electrode of the semiconductor element with solder is equal to or greater than 10 µm, preferably equal to or greater than 50 µm, further preferably equal to or greater than 100 µm.

Figure 10:
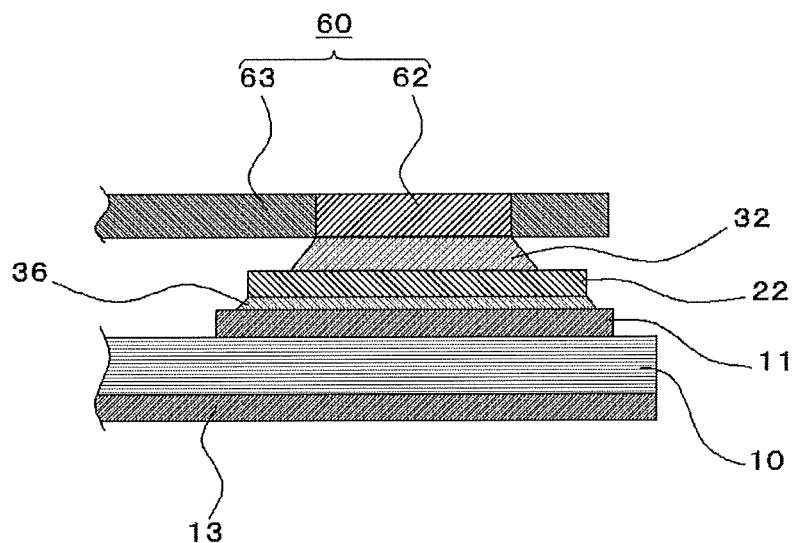
FIG. 10 is a partial cross-sectional view showing another configuration of the solder joint portion between the first lead frame and the front electrode of the semiconductor element in the semiconductor device in the third embodiment of the present invention.

FIG. 10 is a partial cross-sectional view showing another configuration of the solder joint portion between the first lead frame and the front electrode of the semiconductor element in the semiconductor device in the third embodiment of the present invention. In FIG. 10, the same signs as in FIG. 8 denote the same or corresponding components and a description thereof will not be repeated. The present configuration differs from that in FIG. 8 in that electrode plate 63 and metal member 62 are fastened to each other such that the solder joint surface of metal member 62 is flush with the surface of electrode plate 63 of first lead frame 60.

Metal member 62 is inserted and fastened in the opening provided in electrode plate 63 of first lead frame 60. The surface of electrode plate 63 on the side on which solder 32 is joined is flush with the joint surface of metal member 62 that is joined with solder 32. That is, metal member 62 does not have a protrusion protruding from the surface of electrode plate 63. Therefore, solder 32 is provided only on the surface of metal member 62 that is opposed to the front electrode of semiconductor element 22, and the area joined with solder 32 is smaller than in the semiconductor device illustrated shown in FIG. 8 and FIG. 9 or in the first and second embodiments in which metal member 62 has a protrusion. This configuration reduces the bonding strength of solder 32. However, as shown in FIG. 10, in metal member 62, the surface of electrode plate 63 on the side joined with solder 32 may be flush with the joint surface of metal member 62 that is joined with solder 32. Since metal member 62 is positioned inside of the outer periphery of the front electrode of semiconductor element 22 in a two-dimensional view, solder 32 is formed in a fillet shape flared toward the front electrode of semiconductor element 22, thereby achieving high joint reliability.

In FIG. 10, metal member 62 is inserted and fastened in the opening provided in electrode plate 63 and passing through electrode plate 63. However, metal member 62 may be inserted and fastened in the opening that is a blind hole provided in electrode plate 63 as shown in FIG. 8. Also in this case, the surface of electrode plate 63 on the side joined with solder 32 may be flush with the joint surface of metal member 62 that is joined with solder 32.

Fourth Embodiment

Figure 11:
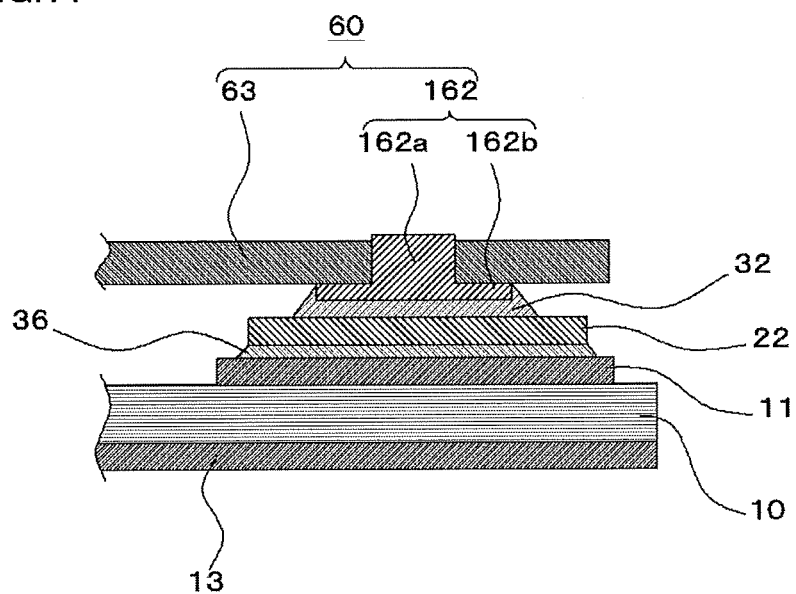
FIG. 11 is a partial cross-sectional view showing a configuration of the solder joint portion between the first lead frame and the front electrode of the semiconductor element in a semiconductor device in a fourth embodiment of the present invention.

FIG. 11 is a partial cross-sectional view showing a configuration of the solder joint portion between the first lead frame and the front electrode of the semiconductor element in the semiconductor device in a fourth embodiment of the present invention. Although FIG. 11 shows a configuration of the solder joint portion between semiconductor element 22 and metal member 62, the solder joint portion between semiconductor element 21 and metal member 61 has a similar configuration, as in the semiconductor device illustrated in the third embodiment. In FIG. 11, the same signs as in FIG. 1, FIG. 2 and FIG. 8 denote the same or corresponding components and a description thereof will not be repeated. The fourth embodiment differs from the first embodiment of the present invention in the structure of a metal member 162 forming first lead frame 60.

As shown in FIG. 11, first lead frame 60 is configured with electrode plate 63 of aluminum or aluminum alloy and metal member 162 of a solder-wettable metal such as copper or copper alloy, and metal member 162 and electrode plate 63 are fastened to each other. Metal member 162 has an insertion portion 162a inserted in the opening provided in electrode plate 63 and a joint portion 162b having a joint surface joined to the front electrode of semiconductor element 22 with solder 32. In a two-dimensional view, the area of joint portion 162b is larger than the area of insertion portion 162a. That is, the area of the joint surface of metal member 162 is larger than the area of the opening provided in electrode plate 63 in a two-dimensional view. The area of joint portion 162b is smaller than the area of the front electrode of semiconductor element 22 in a two-dimensional view.

Metal member 162 is fastened to electrode plate 63 by inserting insertion portion 162a into the opening of electrode plate 63 by the methods described in the first embodiment, such as shrink fitting and pressing. Joint portion 162b of metal member 162 is a protrusion protruding from the surface of electrode plate 63, and the front electrode of semiconductor element 22 and joint portion 162b of metal member 162 are joined with solder 32. First lead frame 60 is thus electrically connected to semiconductor element 22.

In this manner, metal member 162 is configured with insertion portion 162a inserted in electrode plate 63 and joint portion 162b having a joint surface with an area larger than the opening of electrode plate 63 in a two-dimensional view. With this configuration, even when the width of electrode plate 63 is not sufficiently large and equivalent to the width of joint portion 162b, the joint area by which metal member 162 is joined to the front electrode of semiconductor element 22 with solder 32 is ensured sufficiently, and metal member 162 and electrode plate 63 can be fastened firmly. As a result, good electrical conduction and heat conduction can be achieved between first lead frame 60 and semiconductor element 22.

In FIG. 11, joint portion 162b can be described as a protrusion because joint portion 162b of metal member 162 protrudes from the surface of electrode plate 63. However, joint portion 162b may not necessarily protrude from the surface of electrode plate 63. That is, electrode plate 63 may have a recess for receiving joint portion 162b, and joint portion 162b may be fitted in the recess so that joint portion 162b does not protrude from the surface of electrode plate 63.

Figure 12:
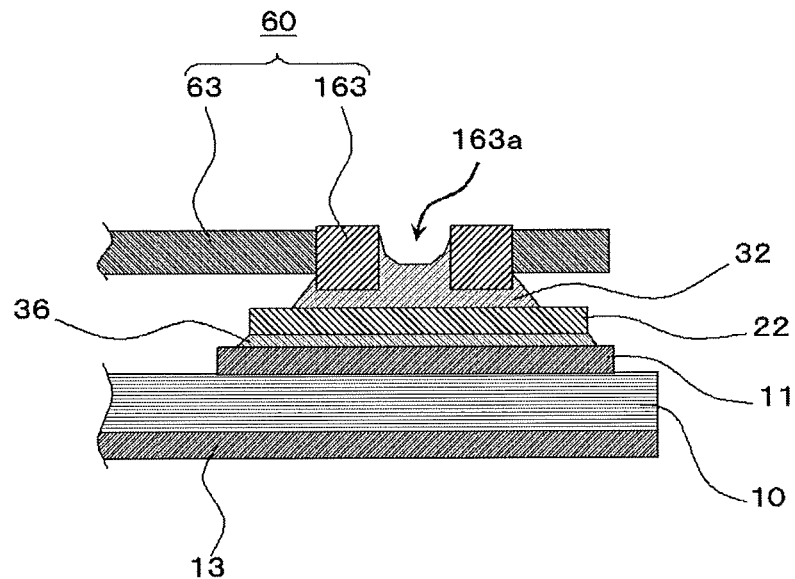
FIG. 12 is a partial cross-sectional view showing another configuration of the solder joint portion between the first lead frame and the front electrode of the semiconductor element in the semiconductor device in the fourth embodiment of the present invention.

FIG. 12 is a partial cross-sectional view showing another configuration of the solder joint portion between the first lead frame and the front electrode of the semiconductor element in the semiconductor device in the fourth embodiment of the present invention. Although FIG. 12 shows a configuration of the solder joint portion between semiconductor element 22 and metal member 62 as in FIG. 11, the solder joint portion between semiconductor element 21 and metal member 61 has a similar configuration. In FIG. 12, the same signs as in FIG. 11 denote the same or corresponding components and a description thereof will not be repeated. FIG. 12 differs from FIG. 11 in that a metal member 163 forming first lead frame 60 has a recess 163a depressed relative to the joint surface of metal member 163.

As shown in FIG. 12, first lead frame 60 is configured such that electrode plate 63 and metal member 163 are fastened to each other. Metal member 163 has a recess 163a in the joint surface provided with solder 32. Recess 163a is a through hole passing through metal member 163. Therefore, solder 32 enters recess 163a. Recess 163a is not limited to a through hole passing through metal member 163 and may have any shape that is depressed from the joint surface of metal member 163 so that solder 32 can enter recess 163a.

In this manner, the joint surface of metal member 163 has recess 163a that allows to solder 32 to enter. In this configuration, even when the amount of solder 32 provided between the front electrode of semiconductor element 22 and metal member 163 is excessive, the excessive amount of solder is drawn up into recess 163a. This prevents solder from spreading to the periphery of the joint portion between the front electrode of semiconductor element 22 and metal member 163 and adhering to the peripheral part to cause a short-circuit failure.

The recess shown in FIG. 12 may be provided in the metal member having the insertion portion and the joint portion shown in FIG. 11. The metal member having the shape shown in FIG. 11 achieves the similar effects.

Fifth Embodiment

Figure 13:
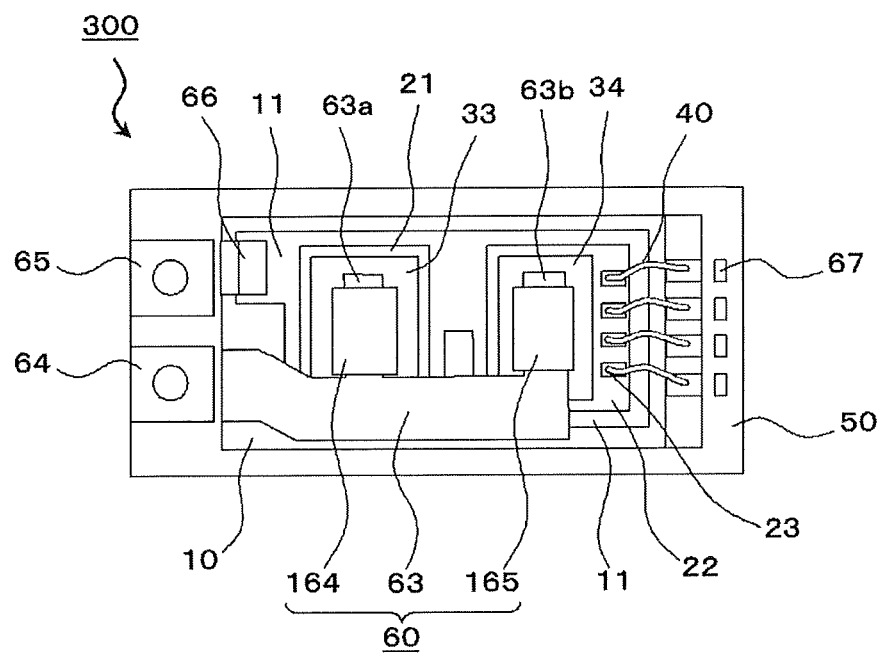
FIG. 13 is a plan view showing a semiconductor device in a fifth embodiment of the present invention.
Figure 14:
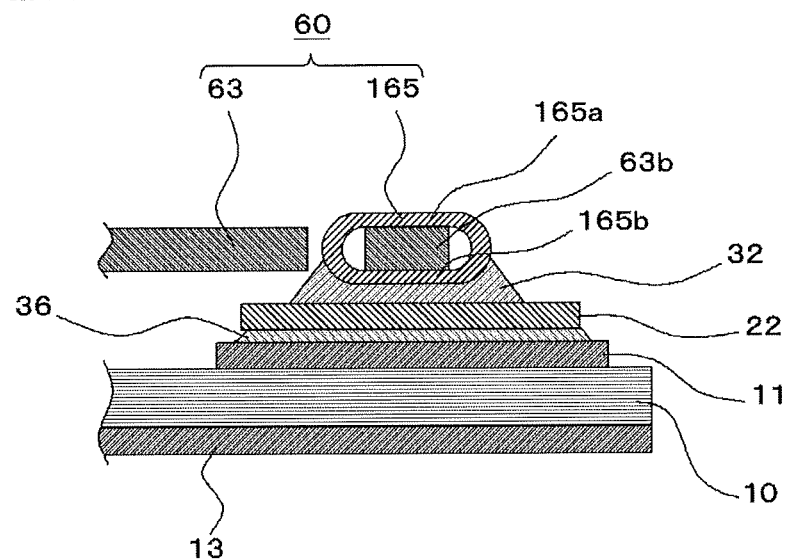
FIG. 14 is a partial cross-sectional view showing a configuration of the solder joint portion between the first lead frame and the front electrode of the semiconductor element in the semiconductor device in the fifth embodiment of the present invention.

FIG. 13 is a plan view showing a semiconductor device in a fifth embodiment of the present invention. FIG. 14 is a partial cross-sectional view showing a configuration of the solder joint portion between the first lead frame and the front electrode of the semiconductor element in the semiconductor device in the fifth embodiment of the present invention. In FIG. 13 and FIG. 14, the same signs as in FIG. 1 denote the same or corresponding components and a description thereof will not be repeated. The fifth embodiment differs from the first embodiment of the present invention in the structure of first lead frame 60. In FIG. 13, the sealing resin portion is not shown.

As shown in FIG. 13 and FIG. 14, first lead frame 60 of a semiconductor device 300 is configured such that a metal member 165 formed with a metal tube formed of a solder-wettable metal such as copper or copper alloy is fastened to electrode plate 63 formed of aluminum or aluminum alloy. The metal tube forming metal member 165 has a flat pipe shape. Electrode plate 63 has an extending portion 63a and an extending portion 63b provided so as to branch from electrode plate 63. A pipe-shaped metal member 164 is put onto extending portion 63a and a pipe-shaped metal member 165 is put onto extending portion 63b. Metal members 164, 165 are then fastened to extending portions 63a, 63b of electrode plate 63 by thermocompression bonding.

As shown in FIG. 14, metal member 165 has a pair of holding portions 165a, 165b opposed to each other. Extending portion 63b of electrode plate 63 is held between a pair of holding portions 165a, 165b to be fastened to metal member 165. Holding portions 165a, 165b are each formed with the tube sidewall of metal member 165 that is a metal tube. This is applicable to metal member 164. Metal members 164, 165 have an oval cross section, for example, with the longitudinal axis of 6 mm and the short axis of 2 mm on the outer side and a thickness of 0.4 mm and are formed in the shape of a pipe with a length of 8 mm. Extending portions 63a, 63b of electrode plate 63 have, for example, a length of 10 mm, a width of 4 mm, and a thickness of 0.6 mm.

As shown in FIG. 14, the front electrode of semiconductor element 22 joined to conductor layer 11 of insulating substrate 10 with bonding material 36 and metal member 165 fastened to electrode plate 63 of first lead frame 60 are joined with solder 32. That is, electrode plate 63 is electrically connected to the front electrode of semiconductor element 22 through metal member 165. Metal member 164 is configured similarly, and electrode plate 63 is electrically connected to the front electrode of semiconductor element 21 through metal member 164.

As shown in FIG. 13, metal member 164 is positioned inside of the outer periphery of front electrode 33 of semiconductor element 21 in a two-dimensional view, and metal member 165 is positioned inside of the outer periphery of front electrode 34 of semiconductor elements 22 in a two-dimensional view. Metal member 164 has an area smaller than front electrode 33 of semiconductor element 21 in a two-dimensional view, and metal member 165 has an area smaller than front electrode 34 of semiconductor element 22 in a two-dimensional view. As a result, as shown in FIG. 14, solder 32 that joins the front electrode of semiconductor element 22 and metal member 165 has a fillet shape flared toward the front electrode of semiconductor element 22 to join the front electrode of semiconductor element 22 and metal member 165 firmly and reliably. This is applicable to the joining between the front electrode of semiconductor element 21 and metal member 164.

Figure 15:
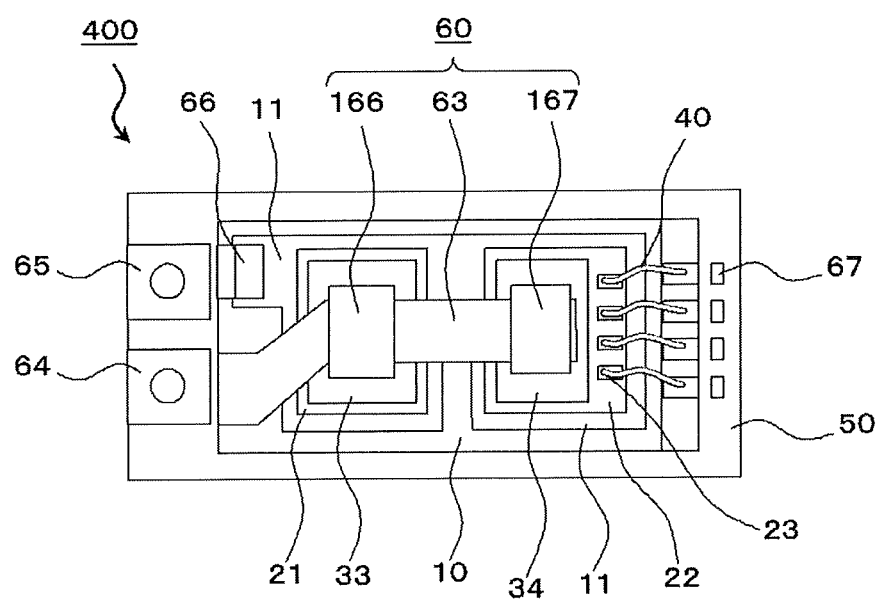
FIG. 15 is a plan view showing a semiconductor device in another configuration in the fifth embodiment of the present invention.

FIG. 15 is a plan view showing a semiconductor device in another configuration in the fifth embodiment of the present invention. In FIG. 15, the same signs as in FIG. 13 denote the same or corresponding components and a description thereof will not be repeated. The present semiconductor device differs from that in FIG. 13 in the structure of first lead frame 60. In FIG. 15, the sealing resin portion is not shown as in FIG. 13.

As shown in FIG. 15, in a semiconductor device 400, first lead frame 60 is configured such that metal members 166, 167 formed with metal tubes of a solder-wettable material such as copper or copper alloy are fastened to electrode plate 63. Metal members 166, 167 have a flat pipe shape in the same manner as the metal members shown in FIG. 13 and FIG. 14. Unlike the semiconductor device in FIG. 13, electrode plate 63 does not have a branching extending portion. Pipe-shaped metal members 166, 167 are put onto electrode plate 63, and metal members 166, 167 are fastened at a predetermined position of electrode plate 63. Similar to the structure shown in FIG. 14, metal members 166, 167 have a pair of holding portions opposed to each other, and electrode plate 63 is held between a pair of holding portions, whereby metal members 166, 167 and electrode plate 63 are fastened to each other. Metal members 166, 167 have an oval cross-section, for example, with the longitudinal axis of 8 mm and the short axis of 2 mm on the outer side and a thickness of 0.4 mm and is formed in the shape of a pipe with a length of 6 mm. Electrode plate 63 is formed, for example, with a width of 6 mm and a thickness of 0.6 mm. Metal members 166, 167 are then fastened to electrode plate 63 by thermocompression bonding.

As shown in FIG. 15, metal members 166, 167 are positioned inside of the outer peripheries of front electrodes 33, 34 of semiconductor elements 21, 22 in a two-dimensional view. Metal members 166, 167 have an area smaller than front electrodes 33, 34 of semiconductor elements 21, 22 in a two-dimensional view. Metal member 166 and front electrode 33 of semiconductor element 21 are joined with solder, and metal member 167 and the front electrode 34 of semiconductor elements 22 are jointed with solder, whereby first lead frame 60 is electrically connected to semiconductor elements 21, 22. In semiconductor device 400, firm and reliable joint can be achieved because a required amount of solder is kept between the front electrodes of semiconductor elements 21, 22 and metal members 166, 167, as in the semiconductor device described in the first embodiment.

As explained in the present fifth embodiment, the metal member fastened to electrode plate 63 holds electrode plate 63 between a pair of holding portions opposed to each other. In this configuration, a metal member with good solder weldability can be fastened to electrode plate 63 of aluminum or aluminum alloy not wettable by solder, by a process using a simple tool such as a crimping plier. This can reduce manufacturing costs of the semiconductor device. In the present fifth embodiment, the metal member formed with a metal pipe is put onto the electrode plate. However, the metal member is not limited to a metal tube as long as it has a shape holding the electrode plate. For example, the metal member may be formed with a metal plate folded into the U shape in cross section.

In the present fifth embodiment, the metal member is made of a solder-wettable metal such as copper or copper alloy. However, a clad pipe formed of aluminum on the inner diameter side and copper on the outer diameter side may be used as the metal member. That is, the metal member may be a clad pipe having a first metal layer of copper on the outer side and a second metal layer of aluminum laminated on the inner diameter side of the first metal layer. When the metal member is formed with such a clad pipe formed of aluminum and copper, aluminum on the inner diameter side improves the joint characteristic between the electrode plate and the metal member, and copper on the outer diameter side enables solder joining with the front electrode of the semiconductor element.

Sixth Embodiment

Figure 16:
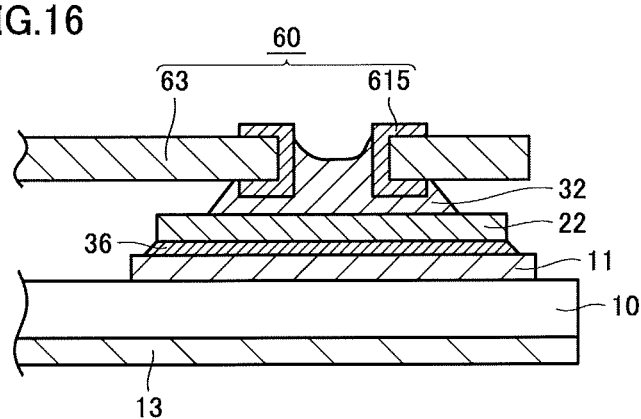
FIG. 16 is a partial cross-sectional view showing a configuration of the solder joint portion between the first lead frame and the front electrode of the semiconductor element in a semiconductor device in a sixth embodiment of the present invention.

FIG. 16 is a partial cross-sectional view showing a configuration of the solder joint portion between the first lead frame and the front electrode of the semiconductor element in a semiconductor device in a sixth embodiment of the present invention. Although FIG. 16 shows a configuration of the solder joint portion between semiconductor element 22 and metal member 62 as in FIG. 12 illustrated in the fourth embodiment, the solder joint portion between semiconductor element 21 and metal member 61 has a similar configuration. In FIG. 16, the same signs as in FIG. 12 denote the same or corresponding components and a description thereof will not be repeated. FIG. 16 differs from FIG. 12 showing the embodiment in that metal member 62 forming first lead frame 60 is formed in the shape of a crimped ring.

As shown in FIG. 16, metal member 62 is a ring-shaped member 615. Ring-shaped member 615 is made of copper. Ring-shaped member 615 has an opening at the center. Ring-shaped member 615 is inserted and fixed to the opening by crimping. That is, ring-shaped member 615 is fixed by crimping after being inserted into the opening of electrode plate 63. Ring-shaped member 615 is squeezed on both surfaces of electrode plate 65 and expands to be larger than the opening of electrode plate 63. A joint portion involving metal diffusion may be formed at least partially between metal member 62 and electrode plate 63.

Ring-shaped member 615 squeezed on both surfaces of electrode plate 65 and expanding to be larger than the opening of electrode plate 63 can ensure a large joint area of metal member 62 to electrode plate 63. The opening at the center of ring-shaped member 615 has the function of adjusting excessive solder. For example, thermal treatment for promoting metal diffusion between members may achieve the effects such as increasing mechanical strength.

Seventh Embodiment

Figure 17:
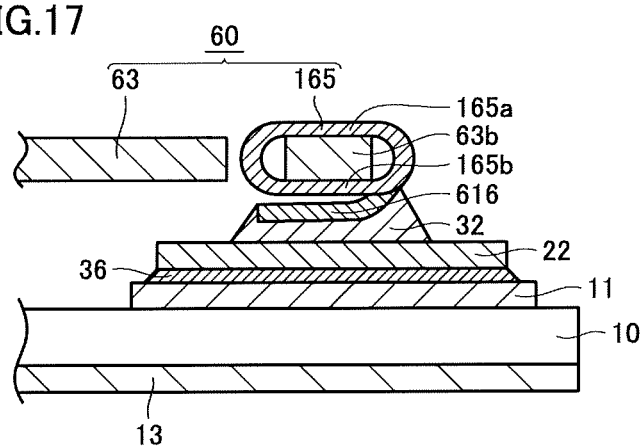
FIG. 17 is a partial cross-sectional view showing a configuration of the solder joint portion between the first lead frame and the front electrode of the semiconductor element in a semiconductor device in a seventh embodiment of the present invention.

FIG. 17 is a partial cross-sectional view showing a configuration of the solder joint portion between the first lead frame and the front electrode of the semiconductor element in a semiconductor device in a seventh embodiment of the present invention. In FIG. 17, the same signs as in FIG. 14 in the fifth embodiment denote the same or corresponding components and a description thereof will not be repeated. The seventh embodiment differs from FIG. 14 showing the fifth embodiment of the present invention in the structure of metal tube.

Figure 18:
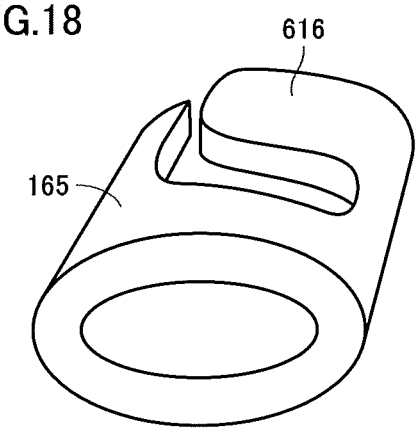
FIG. 18 is a perspective view showing a configuration of a metal member formed with a metal tube in the semiconductor device in the seventh embodiment of the present invention.

FIG. 18 is a perspective view showing a configuration of a metal member 165 formed with a metal tube. Part of the portion of the metal tube that faces front electrodes 33, 34 of semiconductor elements 21, 22 has spring characteristics. Part of metal member 62 is formed into a protrusion 616 having spring characteristics, independent of the pipe portion, by etching or pressing. Protrusion 616 is elastically deformable in the short axis direction of the pipe portion.

Since part of the portion of the metal tube that faces front electrodes 33, 34 of semiconductor elements 21, 22 has spring characteristics, soldering is facilitated even when the process accuracy of electrode plate 63 is poor. This can reduce stress on the solder joint portion.

Referring now to FIG. 19 to FIG. 22, the metal members shown in FIG. 2, FIG. 8, FIG. 10, and FIG. 14 are each configured with a plurality of metal layers. FIG. 19 to FIG. 22 correspond to FIG. 2, FIG. 8, FIG. 10, and FIG. 14, respectively. The configuration in each of FIG. 19 to FIG. 22 is similar to the corresponding configuration in FIG. 2, FIG. 8, FIG. 10, and FIG. 14, unless otherwise specified.

Figure 19:
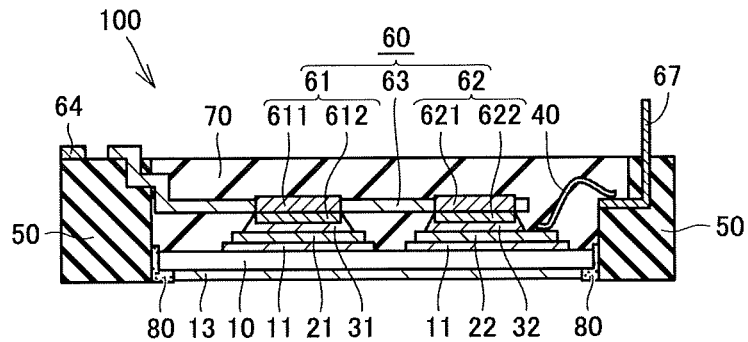
FIG. 19 is a cross-sectional view corresponding to FIG. 2, showing a semiconductor device in which the metal member is configured with a plurality of metal layers stacked.

As shown in FIG. 19, metal member 61 is configured with a first metal layer 611 and a second metal layer 612 stacked on first metal layer 611. Second metal layer 612 is disposed closer to insulating substrate 10 than first metal layer 611. Metal member 62 is configured with a first metal layer 621 and a second metal layer 622 stacked on first metal layer 621. Second metal layer 622 is disposed closer to insulating substrate 10 than first metal layer 621.

Figure 20:
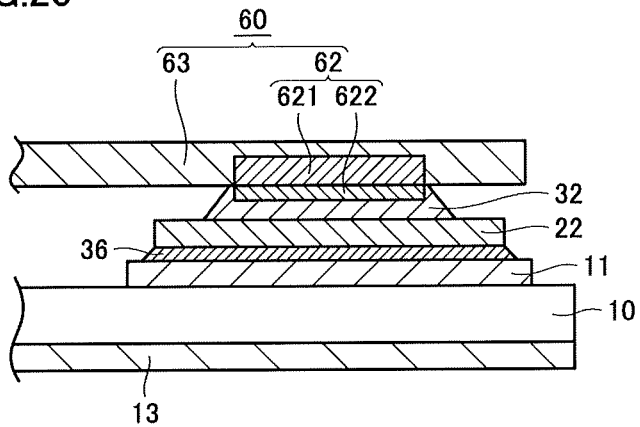
FIG. 20 is a partial cross-sectional view corresponding to FIG. 8, showing a configuration of the solder joint portion between the first lead frame and the front electrode of the semiconductor element, in which the metal member is configured with a plurality of metal layers stacked.

As shown in FIG. 20, metal member 62 is configured with a first metal layer 621 and a second metal layer 622 stacked on first metal layer 621. Second metal layer 622 is disposed closer to insulating substrate 10 than first metal layer 621.

Figure 21:
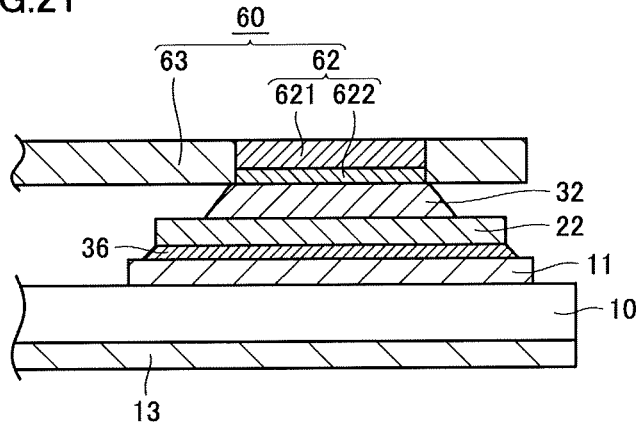
FIG. 21 is a partial cross-sectional view corresponding to FIG. 10, showing another configuration of the solder joint portion between the first lead frame and the front electrode of the semiconductor element, in which the metal member is configured with a plurality of metal layers stacked.

As shown in FIG. 21, metal member 62 is configured with a first metal layer 621 and a second metal layer 622 stacked on first metal layer 621. Second metal layer 622 is disposed closer to insulating substrate 10 than first metal layer 621.

Figure 22:
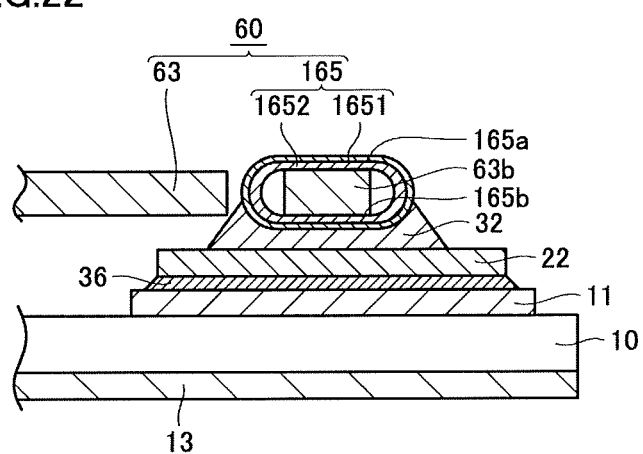
FIG. 22 is a partial cross-sectional view corresponding to FIG. 14, showing a configuration of the solder joint portion between the first lead frame and the front electrode of the semiconductor element, in which the metal member is configured with a plurality of metal layers stacked.

As shown in FIG. 22, metal member 165 is configured with a first metal layer 1651 and a second metal layer 1652 stacked on first metal layer 1651. Second metal layer 1652 is disposed on the inside of first metal layer 1651.

REFERENCE SIGNS LIST 21, 22 semiconductor element
31, 32 solder
33, 34 front electrode
60 first lead frame
61, 62, 161, 162, 163, 164, 165, 166, 167 metal member
63 electrode plate
162a insertion portion, 162b joint portion
163a recess
165a, 165b holding portion
100, 200, 300, 400 semiconductor device

The invention claimed is:

1. A semiconductor device comprising:
a semiconductor element having a front electrode;
an electrode plate having an area larger than the front electrode of the semiconductor element in a two-dimensional view and formed of aluminum or aluminum alloy; and
a metal member having a joint surface joined to the front electrode of the semiconductor element with a bonding material, having an area smaller than the front electrode of the semiconductor element in a two-dimensional view, formed of a metal different from the electrode plate, and fastened to the electrode plate to electrically connect the front electrode of the semiconductor element to the electrode plate, wherein
the metal member has a protrusion protruding from a surface of the electrode plate,
the protrusion has a bottom surface opposed to the front electrode of the semiconductor element and a side surface disposed between the bottom surface and the electrode plate, and
the joint surface includes the bottom surface and the side surface, and the bonding material is disposed on the bottom surface and the side surface.

2. The semiconductor device according to claim 1, wherein the metal member is formed only with a first metal layer having the joint surface.

3. The semiconductor device according to claim 2, wherein the first metal layer of the metal member is made of copper or copper alloy.

4. The semiconductor device according to claim 1, wherein
the metal member includes a plurality of metal layers stacked, and
the metal layers include a first metal layer having the joint surface and a second metal layer formed of a metal different from the first metal layer.

5. The semiconductor device according to claim 1, wherein
the joint surface of the metal member has a recess, and
the bonding material is disposed in the recess.

6. The semiconductor device according to claim 1, wherein
the metal member has a pair of holding portions opposed to each other, and the electrode plate is held between the holding portions of the metal member.

7. The semiconductor device according to claim 6, wherein the metal member is formed with a metal tube, and the holding portions are formed with tube sidewalls of the metal tube.

8. The semiconductor device according to claim 7, wherein part of a portion of the metal tube facing the front electrode of the semiconductor element has spring characteristics.

9. The semiconductor device according to claim 1, wherein a joint portion involving metal diffusion is formed at least partially between the metal member and the electrode plate.

10. A semiconductor device comprising:
a semiconductor element having a front electrode;
an electrode plate having an area lamer than the front electrode of the semiconductor element in a two-dimensional view and formed of aluminum or aluminum alloy; and
a metal member having a joint surface joined to the front electrode of the semiconductor element with a bonding material, having an area smaller than the front electrode of the semiconductor element in a two-dimensional view, formed of a metal different from the electrode plate, and fastened to the electrode plate to electrically connect the front electrode of the semiconductor element to the electrode plate, wherein the metal member is formed only with a first metal layer having the joint surface, and
the first metal layer of the metal member has a thickness equal to or greater than 10 μm.

11. A semiconductor device comprising:
a semiconductor element having a front electrode;
an electrode plate having an area lamer than the front electrode of the semiconductor element in a two-dimensional view and formed of aluminum or aluminum alloy; and
a metal member having a joint surface joined to the front electrode of the semiconductor element with a bonding material, having an area smaller than the front electrode of the semiconductor element in a two-dimensional view, formed of a metal different from the electrode plate, and fastened to the electrode plate to electrically connect the front electrode of the semiconductor element to the electrode plate,
wherein the electrode plate has an opening, and the metal member is disposed in the opening.

12. The semiconductor device according to claim 11, wherein the joint surface of the metal member has an area larger than an area of the opening of the electrode plate in a two-dimensional view.

13. The semiconductor device according to claim 12, wherein the metal member is a ring-shaped member and fixed in the opening by crimping.

* * * * *